(12) United States Patent
Choi et al.

(10) Patent No.: US 9,377,649 B2
(45) Date of Patent: Jun. 28, 2016

(54) DISPLAY DEVICE AND METHOD OF MANUFACTURING THE SAME

(71) Applicant: Samsung Display Co., Ltd., Yongin, Gyeonggi-Do (KR)

(72) Inventors: Sanggun Choi, Gyeonggi-do (KR); Seungyeon Chae, Hwaseong-si (KR); Taewoon Cha, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/459,189

(22) Filed: Aug. 13, 2014

(65) Prior Publication Data

US 2015/0198825 A1    Jul. 16, 2015

(30) Foreign Application Priority Data

Jan. 10, 2014    (KR) .......................... 10-2014-0003531

(51) Int. Cl.

| G02F 1/1333 | (2006.01) |
|---|---|
| G02F 1/1334 | (2006.01) |
| G02F 1/1335 | (2006.01) |
| G02F 1/1368 | (2006.01) |
| G02F 1/1339 | (2006.01) |
| H01L 21/56 | (2006.01) |
| G02F 1/1362 | (2006.01) |

(52) U.S. Cl.
CPC ............ *G02F 1/1334* (2013.01); *G02F 1/1339* (2013.01); *G02F 1/1368* (2013.01); *G02F 1/133377* (2013.01); *G02F 1/133512* (2013.01); *G02F 1/133514* (2013.01); *G02F 1/133555* (2013.01); *H01L 21/56* (2013.01); *G02F 1/136209* (2013.01); *G02F 2001/136222* (2013.01)

(58) Field of Classification Search
CPC ..................... G02F 1/133377; G02F 1/133351
See application file for complete search history.

(56) References Cited

U.S. PATENT DOCUMENTS

| 6,400,430 | B2 | 6/2002 | Nakao et al. | |
|---|---|---|---|---|
| 6,654,087 | B2 | 11/2003 | Song et al. | |
| 7,830,478 | B2 | 11/2010 | Lee et al. | |
| 8,094,268 | B2 | 1/2012 | Okabe et al. | |
| 2009/0141214 | A1* | 6/2009 | Suzuki .............. | G02F 1/133377 349/75 |
| 2013/0182203 | A1* | 7/2013 | Lee ................... | G02F 1/133377 349/106 |
| 2013/0308071 | A1* | 11/2013 | Kim ....................... | H01L 33/08 349/43 |
| 2014/0125910 | A1* | 5/2014 | Kim .................. | G02F 1/133377 349/46 |
| 2014/0293205 | A1* | 10/2014 | Kim .................. | G02F 1/133377 349/138 |
| 2015/0109566 | A1* | 4/2015 | Yun ................... | G02F 1/133555 349/113 |

FOREIGN PATENT DOCUMENTS

| JP | 2004-093781 A | 3/2004 |
|---|---|---|
| JP | 2011-070079 A | 4/2011 |
| KR | 10-2008-0062101 A | 7/2008 |
| KR | 10-2008-0112701 A | 12/2008 |
| KR | 10-2015-0076880 A | 7/2015 |

\* cited by examiner

*Primary Examiner* — Mariceli Santiago

(74) *Attorney, Agent, or Firm* — Innovation Counsel LLP

(57) ABSTRACT

A display device includes a substrate including a plurality of pixel areas and a non-pixel area disposed between the pixel areas, a tunnel-shaped cavity disposed on the substrate in each of the pixel areas, an image display layer disposed in the tunnel-shaped cavity, a roof layer disposed on the tunnel-shaped cavity and having an upper planarized surface, a black matrix disposed on the substrate in the non-pixel area, and a reflective electrode disposed under the tunnel-shaped cavity in a predetermined area of each of the pixel areas to reflect an external light.

13 Claims, 20 Drawing Sheets

DISPLAY DEVICE AND METHOD OF MANUFACTURING THE SAME

CROSS-REFERENCE TO RELATED APPLICATION

This U.S. non-provisional patent application claims priority under 35 U.S.C. §119 to Korean Patent Application No. 10-2014-0003531 filed Jan. 10, 2014, the contents of which are hereby incorporated by reference in their entirety.

BACKGROUND

1. Field of Disclosure

The present disclosure relates to a display device and a method of manufacturing the display device.

2. Description of the Related Art

In recent years, various display devices, such as liquid crystal display devices, organic light emitting diode display devices, electrowetting display devices, plasma display panels, electrophoretic display devices, etc., have been developed.

In general, a display device includes two substrates and an image display part interposed between the two substrates. The two substrates face each other and are coupled to each other. The two substrates are spaced apart from each other by a predetermined distance such that the image display part is disposed between the two substrates.

When the display device is manufactured, a spacer is formed on one of the two substrates to maintain a distance between the two substrates. The spacer is attached to the other of the two substrates using an adhesive. However, the formation of the spacer and the assembly of the substrate may increase the complexity of the manufacturing process, thereby increasing the manufacturing cost of the display device.

SUMMARY

The present disclosure relates to a transflective display device.

According to some embodiments of the inventive concept, a display device is provided. The display device includes: a substrate including a plurality of pixel areas and a non-pixel area disposed between the pixel areas; a tunnel-shaped cavity disposed on the substrate in each of the pixel areas; an image display layer disposed in the tunnel-shaped cavity; a roof layer disposed on the tunnel-shaped cavity and having an upper planarized surface; a black matrix disposed on the substrate in the non-pixel area; and a reflective electrode disposed under the tunnel-shaped cavity in a predetermined area of each of the pixel areas to reflect an external light.

In some embodiments, the display device may further include a color filter disposed on the substrate in each of the pixel areas.

In some embodiments, the color filter may include a red color filter, a green color filter, or a blue color filter.

In some embodiments, the display device may further include: a first electrode disposed on the color filter; and a second electrode extending in a first direction and spaced apart upward from the substrate in the pixel area and a predetermined area of the non-pixel area to define the tunnel-shaped cavity. The roof layer may be disposed on the second electrode.

In some embodiments, each of the pixel areas may include a transmissive area that transmits light and a reflective area including a reflective electrode disposed therein. The non-pixel area may include a first non-pixel area disposed between the pixel areas in the first direction and extending in a second direction crossing the first direction, and a second non-pixel area disposed between the pixel areas in the second direction and extending in the first direction. The reflective area may be disposed adjacent to the first area, and the second electrode may extend in a first area defined by a predetermined area of the second non-pixel area in the second direction.

In some embodiments, the tunnel-shaped cavity may have a first height in the transmissive area, a second height in the reflective area, and a third height in the first area that does not overlap with the first non-pixel area, wherein the second height may be less than the first height and greater than the third height.

In some embodiments, the second electrode may be spaced apart from the color filter by the first height in the transmissive area, spaced apart from the color filter by the second height in the reflective area, and spaced apart from the black matrix by the third height in the first area that does not overlap with the first non-pixel area.

In some embodiments, the third height may be equal to or less than about 1.1 micrometers.

In some embodiments, the display device may further include a thin film transistor disposed on the substrate in the non-pixel area and connected to the first electrode, and an insulating layer disposed on the substrate covering the thin film transistor and having a concavo-convex shape in the reflective area. The reflective electrode may be disposed on the insulating layer in the reflective area and having the concavo-convex shape, and the color filter and the black matrix may be disposed on the insulating layer.

In some embodiments, the display device may further include an alignment layer disposed on an inner surface of the second electrode in the tunnel-shaped cavity and on the substrate covering the first electrode. The alignment layer may enclose the tunnel-shaped cavity in the first area adjacent to the reflective area.

In some embodiments, the image display layer may have a first distance corresponding to a difference in height between the alignment layer disposed on the first electrode in the transmissive area and the alignment layer disposed on the inner surface of the second electrode in the transmissive area, and a second distance corresponding to a difference in height between the alignment layer disposed on the first electrode in the reflective area and the alignment layer disposed on the inner surface of the second electrode in the reflective area, and wherein the second distance may be about half of the first distance.

In some embodiments, the image display layer may be a liquid crystal layer.

In some embodiments, the display device may further include a sealing layer disposed on the roof layer and covering the substrate to seal the tunnel-shaped cavity.

According to some other embodiments of the inventive concept, a method of manufacturing a display device is provided. The method includes: providing a substrate including a plurality of pixel areas and a non-pixel area between the pixel areas, the substrate including a reflective electrode disposed in a predetermined area of each of the pixel areas to reflect an external light; forming a first electrode on the substrate in each of the pixel areas; forming a sacrificial layer extending in a column direction on the substrate, wherein the sacrificial layer has a first height and a second height in each of the pixel areas and a third height in the non-pixel area, wherein the second height is less than the first height and greater than the third height; forming a second electrode extending in a row direction on the substrate to cover the sacrificial layer in the pixel areas and the predetermined area of the non-pixel area; forming a roof layer covering an upper surface of the second electrode and having an upper planarized surface; wet-etching the sacrificial layer to form a tunnel-shaped cavity between the second electrode and the substrate; providing a liquid crystal layer in the tunnel-shape cavity; and forming a sealing layer on the roof layer to cover the substrate and to seal the tunnel-shaped cavity.

In some embodiments, each of the pixel areas may include a transmissive area that transmits a light, and a reflective area including a reflective electrode disposed therein. The non-pixel area may include a first non-pixel area disposed between the pixel areas in the first direction and extending in a second direction crossing the first direction, and a second non-pixel area disposed between the pixel areas in the second direction and extending in the first direction. The reflective area may be disposed adjacent to the first area, and the second electrode may extend in a first area defined by a predetermined area of the second non-pixel area in the second direction.

In some embodiments, the tunnel-shaped cavity may have the first height in the transmissive area, the second height in the reflective area, and the third height in the first area that does not overlap with the first non-pixel area.

In some embodiments, the third height may be equal to or less than about 1.1 micrometers.

In some embodiments, the method may further include providing an alignment solution in the tunnel-shaped cavity of the substrate, and drying the alignment solution to form an alignment layer on an inner surface of the second electrode and on the substrate. The alignment layer may cover the first electrode, and the alignment layer may be bound in the first area adjacent to the reflective area to enclose the tunnel-shaped cavity.

In some embodiments, the liquid crystal layer may have a first distance corresponding to a difference in height between the alignment layer disposed on the first electrode in the transmissive area and the alignment layer disposed on the inner surface of the second electrode in the transmissive area, and a second distance corresponding to a difference in height between the alignment layer disposed on the first electrode in the reflective area and the alignment layer disposed on the inner surface of the second electrode in the reflective area, and wherein the second distance may be about half of the first distance.

In some embodiments, the substrate may include: a base substrate; a thin film transistor formed on the base substrate in the non-pixel area and connected to the first electrode; an insulating layer disposed on the base substrate covering the thin film transistor and having a concavo-convex shape in the reflective area; a color filter disposed on the insulating layer in the pixel area; and a black matrix disposed on the insulating layer in the non-pixel area, and the reflective electrode may be disposed on the insulating layer in the reflective area and having the concavo-convex shape.

According to the above embodiments, the display device may have a transflective device structure. In addition, the viewing angle of the display device may be increased and the alignment layer may be uniformly formed.

BRIEF DESCRIPTION OF THE DRAWINGS

The above and other advantages of the present disclosure will be readily apparent by reference to the following detailed description when considered in conjunction with the accompanying drawings.

DETAILED DESCRIPTION

Figure 1:
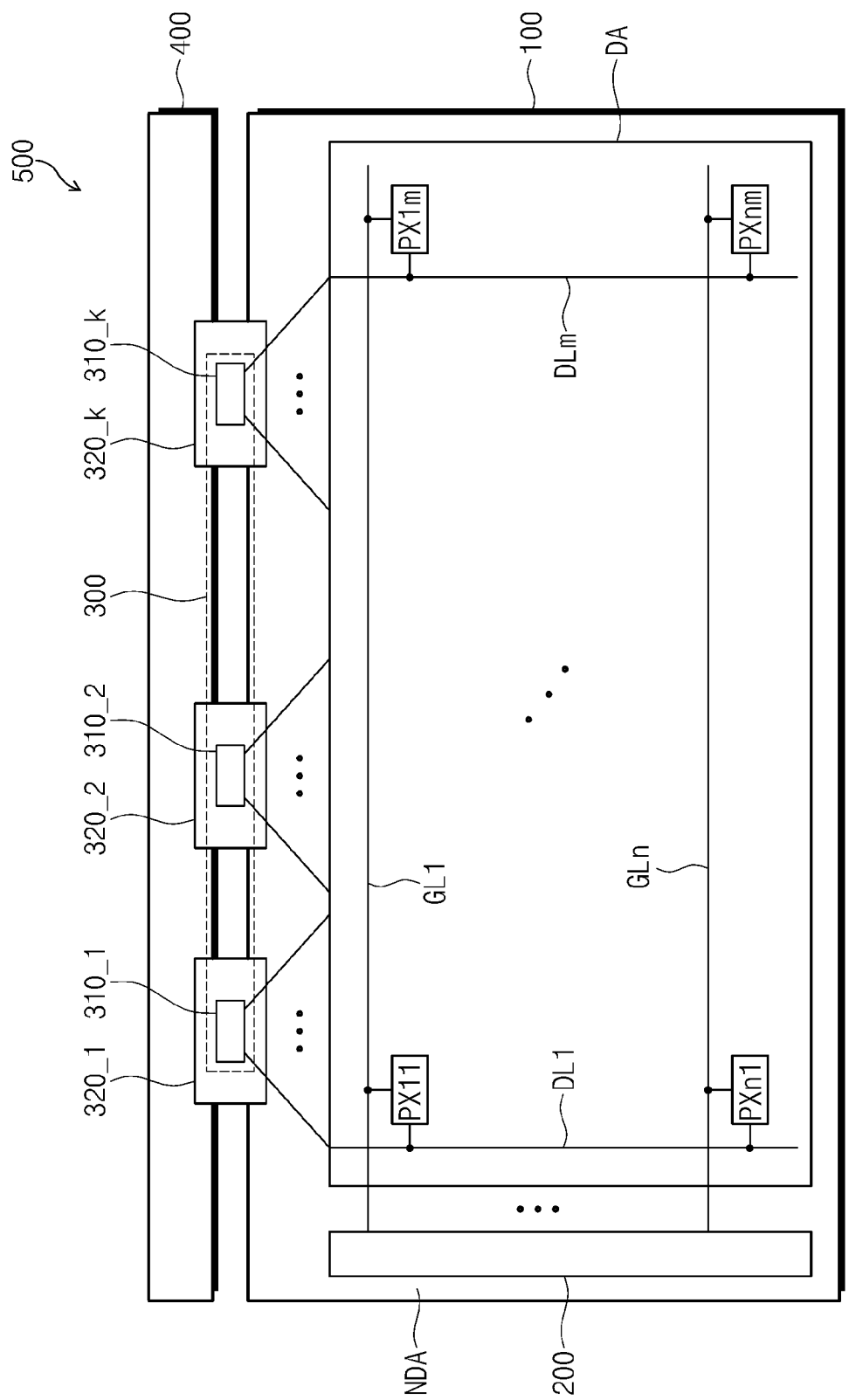
FIG. 1 is a plan view of a display device according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present inventive concept will be explained in detail with reference to the accompanying drawings.

FIG. 1 is a plan view of a display device according to an exemplary embodiment of the present disclosure.

Referring to FIG. 1, a display device 500 includes a display panel 100, a gate driver 200, a data driver 300, and a driving circuit board 400.

The display panel 100 includes a display area DA in which a plurality of pixels PX11 to PXnm are arranged in a matrix form, and a non-display area NDA surrounding the display area DA. The display panel 100 further includes a plurality of gate lines GL1 to GLn, and a plurality of data lines DL1 to DLm insulated from the gate lines GL1 to GLn while crossing the gate lines GL1 to GLn.

The gate lines GL1 to GLn are connected to the gate driver 200 so as to sequentially receive gate signals from the gate driver 200. The data lines DL1 to DLm are connected to the data driver 300 so as to receive data voltages from the data driver 300. The data voltages may be provided in analog form.

The pixels PX11 to PXnm are respectively arranged in areas defined by the gate lines GL1 to GLn and the data lines DL1 to DLm. Therefore, the pixels PX11 to PXnm are arranged in n rows by m columns. In the present exemplary embodiment, each of "m" and "n" is an integer greater than 0.

Each of the pixels PX11 to PXnm is connected to a corresponding gate line of the gate lines GL1 to GLn and a corresponding data line of the data lines DL1 to DLm. The pixels PX11 to PXnm receive the data voltages through the data lines DL1 to DLm in response to the gate signals applied through the gate lines GL1 to GLn. The pixels PX11 to PXnm then display gray scales corresponding to the data voltages.

The gate driver 200 is disposed in a portion of the non-display area NDA adjacent to a left side of the display area DA. In detail, the gate driver 200 may be disposed in the portion of the non-display area NDA adjacent to the left side of the display area DA as an amorphous silicon TFT gate driver circuit (ASG).

The gate driver 200 generates the gate signals in response to a gate control signal applied from a timing controller. The timing controller (not shown) is mounted on the driving circuit board 400. The gate signals are sequentially applied to the pixels PX11 to PXnm through the gate lines GL1 to GLn row by row. Thus, the pixels PX11 to PXnm are driven row by row.

The data driver 300 receives image signals and a data control signal from the timing controller. The data driver 300 generates the data voltages in analog form (corresponding to the image signals) in response to the data control signal. The data driver 300 applies the data voltages to the pixels PX11 to PXnm through the data lines DL1 to DLm.

The data driver 300 includes a plurality of source driving chips 310_1 to 310_k. "k" is an integer greater than 0 and smaller than "m". Each of the source driving chips 310_1 to 310_k is mounted on a corresponding flexible circuit board of flexible circuit boards 320_1 to 320_k, and connected between the driving circuit board 400 and the non-display area NDA disposed adjacent to an upper portion of the display area DA.

In the present exemplary embodiment, the data driver 300 may be connected to the display panel 100 using a tape carrier package (TCP). However, the inventive concept is not limited thereto. In some other embodiments, the source driving chips 310_1 to 310_k may be mounted in the non-display area NDA disposed adjacent to the upper portion of the display area DA using a chip on glass (COG) method.

Figure 2:
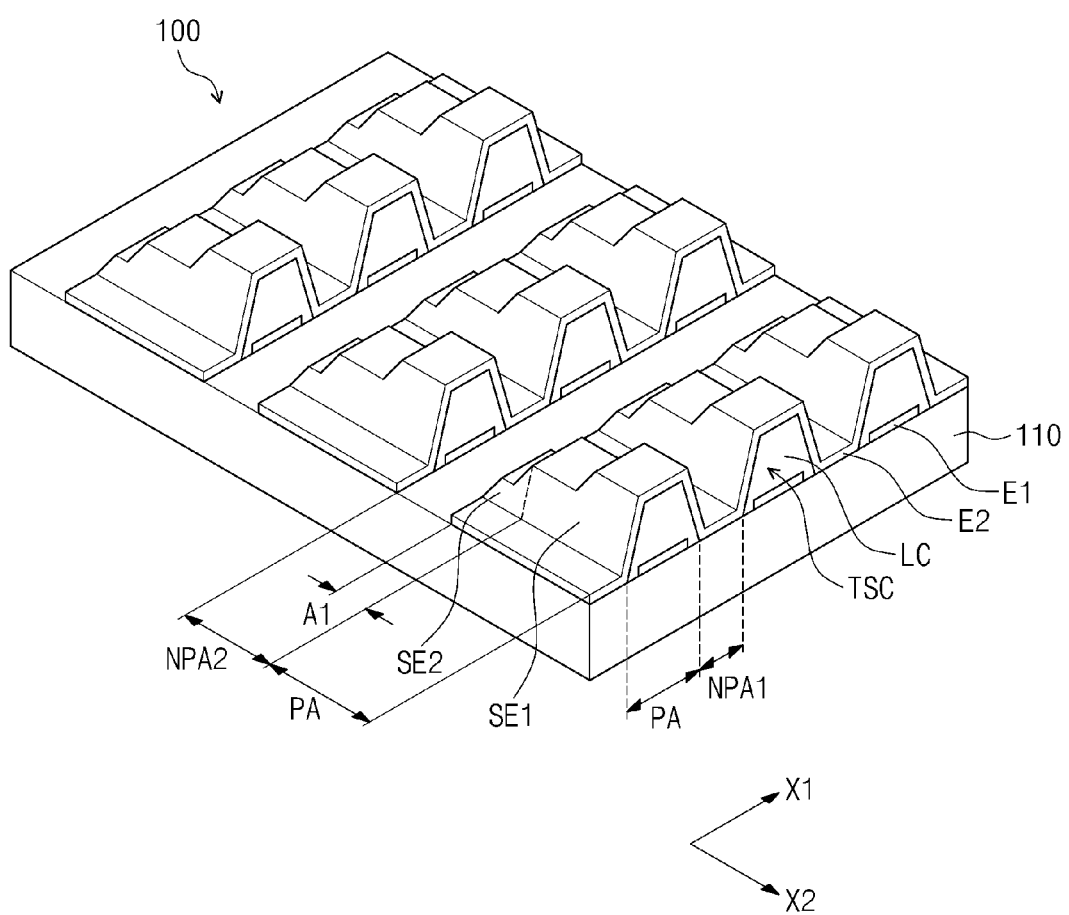
FIG. 2 is a perspective view of a portion of a display area of a display panel shown in FIG. 1.

FIG. 2 is a perspective view of a portion of the display area DA of the display panel 100 of FIG. 1.

Referring to FIG. 2, the display panel 100 includes a substrate 110, and a plurality of first electrodes E1 and second electrodes E2 disposed on the substrate 110.

The substrate 110 includes a plurality of pixel areas PA corresponding respectively to the pixels PX11 to PXnm. The substrate 110 also includes non-pixel areas NPA1 and NPA2 disposed between the pixel areas PA. The pixel areas PA are arranged in a matrix form (similar to the pixels PX11 to PXnm). The non-pixel areas NPA1 and NPA2 correspond to boundary areas between the pixel areas PA.

Hereinafter, a row direction is referred to as a first direction X1 and a column direction crossing the row direction is referred to as a second direction X2.

The non-pixel areas NPA1 and NPA2 include a first non-pixel area NPA1 and a second non-pixel area NPA2. The first non-pixel area NPA1 is disposed between the pixel areas PA in the first direction X1 and extends in the second direction X2. The second non-pixel area NPA2 is disposed between the pixel areas PA in the second direction X2 and extends in the first direction X1. Accordingly, the first non-pixel area NPA1 and the second non-pixel area NPA2 overlap with each other in positions at which the first direction X1 crosses the second direction X2.

The first electrodes E1 corresponding to the pixels PX11 to PXnm are respectively disposed in the pixel areas PX of the substrate 110.

The second electrodes E2 are disposed spaced apart from each other on the substrate 110, and extend in the first direction X1. The second electrodes E2 may be referred to as common electrodes. The second electrodes E2 overlap with the pixel areas PA in the first direction X1 and a predetermined area A1 of the second non-pixel area NPA2 in the second direction X2. Hereinafter, the predetermined area A1 of the second non-pixel area NPA2 is referred to as a first area A1.

The second electrodes E2 are spaced apart upward from the substrate 110 in the pixel areas PA and the first area A1 of the second non-pixel area NPA2, so as to define a tunnel-shaped cavity TSC in each pixel area PA.

In detail, each of the second electrodes E2 includes a first sub-electrode SE1 and a second sub-electrode SE2 extending in the first direction X1. The first sub-electrode SE1 overlaps with the pixel areas PA arranged in the first direction X1 and the first non-pixel area NPA1 between the pixel areas PA in the first direction X1. The first sub-electrode SE1 is disposed adjacent to the substrate 110 in the first non-pixel area NPA1 and spaced apart upward from the substrate 110 in the pixel areas PA.

The second sub-electrode SE2 is connected to the first sub-electrode SE1 and extends to the first area A1 of the second non-pixel area NPA2 in the second direction X2. The second sub-electrode SE2 is disposed adjacent to the substrate 110 in a portion of the first area A1 overlapping with the first non-pixel area NPA1. That is, the second sub-electrode SE2 is disposed adjacent to the substrate 110 in the first non-pixel area NPA1. The second sub-electrode SE2 is spaced apart upward from the substrate 110 in a portion of the first area A1 that does not overlap with the first non-pixel area NPA1.

As shown in FIG. 2, the first sub-electrode SE1 is spaced apart upward from the substrate 110 in the pixel areas PA at two different distances. Specifically, the second sub-electrode E2 is spaced apart upward from the substrate 110 (in the portion of the first area A1 that does not overlap with the first non-pixel area NPA1) by a smaller distance than a distance measured between the substrate 110 and the first sub-electrode SE1.

The tunnel-shaped cavity TSC is defined by a space formed between the first sub-electrode SE1 and the substrate 110 in the pixel areas PA, as well as a space formed between the second sub-electrode SE2 and the substrate 110 in the portion of the first area A1 that does not overlap with the first non-pixel area NPA1. That is, the tunnel-shaped cavity TSC may be defined by the second electrode E2.

An image display layer LC is disposed in the tunnel-shaped cavity TSC. The image display layer LC displays an image in accordance with an electric field formed between the first electrode E1 and the second electrode E2. The image display layer LC may include, but is not limited to, a liquid crystal layer LC. In some other embodiments, the image display layer LC may include an electrophoretic layer or an electrowetting layer. In the embodiments described herein, the image display layer LC corresponds to the liquid crystal layer LC.

The tunnel-shaped cavity TSC extends in the second direction X2, with both end portions of the tunnel-shaped cavity TSC in the second direction X2 being opened. Although not shown in the figures, a roof layer may be disposed on the substrate 110 covering an upper surface of the second electrode E2, and a sealing layer may be disposed on the roof layer. The sealing layer covers the substrate 110 to seal both the end portions of the tunnel-shaped cavity.

Figure 3:
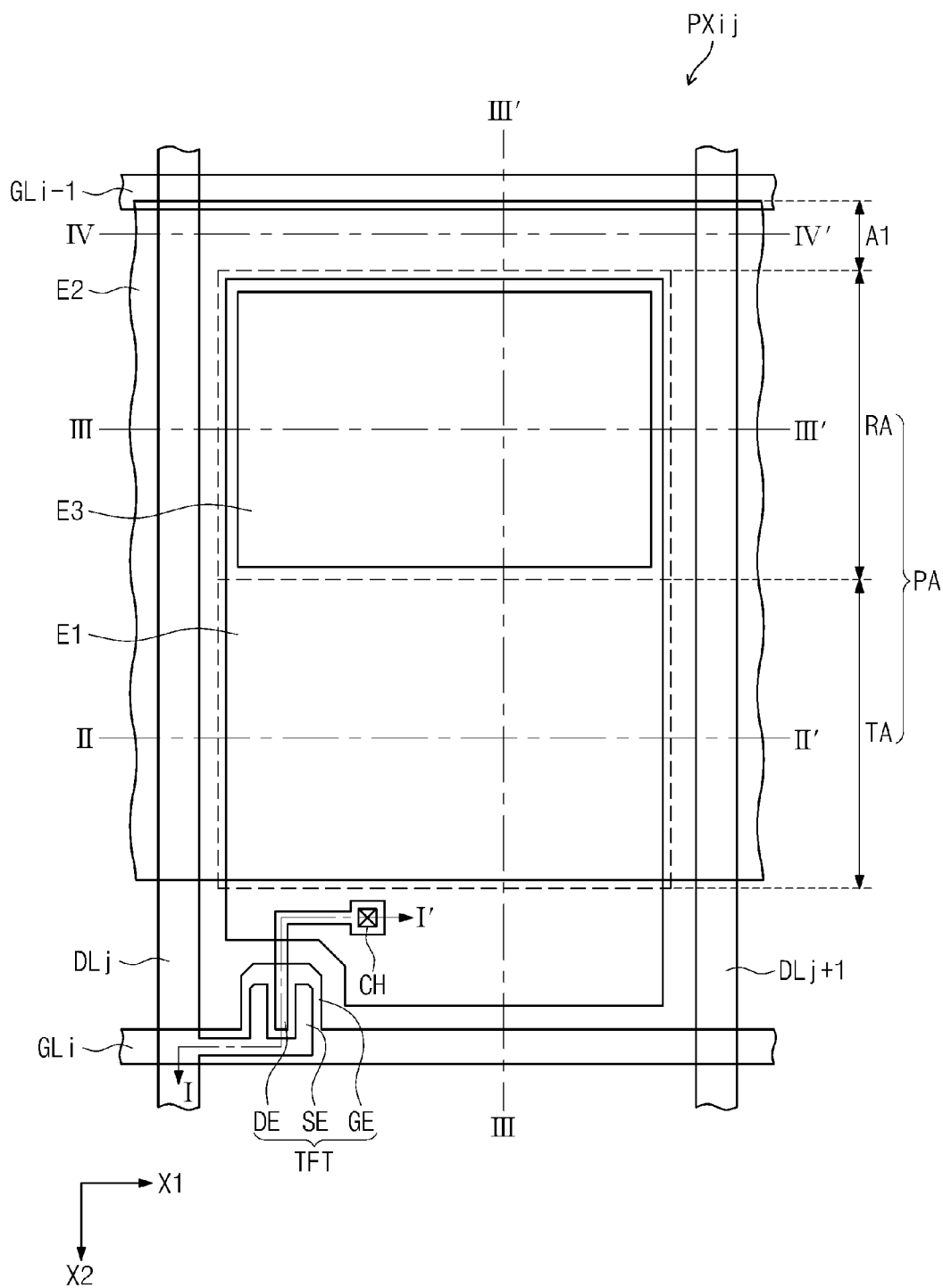
FIG. 3 is a layout diagram of a pixel shown in FIG. 1.

FIG. 3 is a layout diagram of a pixel of FIG. 1.

In the present exemplary embodiment, the pixels have the same structure and function, and thus an exemplary pixel PXij will be described in detail with reference to FIG. 3.

Referring to FIG. 3, the gate lines GLi-1 and GLi extend in the first direction X1, and the data lines DLj and DLj+1 extend in the second direction X2 crossing the gate lines GLi-1 and GLi. Here, "i" is an integer greater than zero (0) and equal to or smaller than "n", and "j" is an integer greater than zero (0) and equal to or smaller than "m". The data lines DLj and DLj+1 are disposed in the first non-pixel area NPA1, and the gate lines GLi-1 and GLi are disposed in the second non-pixel area NPA2.

The pixel PXij includes a thin film transistor TFT connected to the corresponding data line DLj and the corresponding gate line GLi. The thin film transistor TFT is disposed in the second non-pixel area NPA2. The first electrode E1 is connected to the thin film transistor TFT, and a third electrode E3 overlaps with a predetermined area of the first electrode E1. The second electrode E2 forms the tunnel-shaped cavity TSC, and the liquid crystal layer LC is disposed in the tunnel-shaped cavity TSC.

Next, the second electrode E2 (defining the tunnel-shape cavity TSC) and the liquid crystal layer LC disposed in the tunnel-shaped cavity TSC will be described in detail with reference to FIGS. 4 to 6.

The area in which the pixel PXij is formed includes the pixel area PA and also the first and second non-pixel areas NPA1 and NPA2 between the pixel areas PA. An image is displayed in the pixel area PA, but is not displayed in the first and second non-pixel areas NPA1 and NPA2 because the first and second non-pixel areas NPA1 and NPA2 block and prevent light from passing through.

The pixel area PA includes a transmissive area TA and a reflective area RA. The transmissive area TA transmits the light and the reflective area RA reflects an external light. As shown in FIG. 3, the reflective area RA is disposed adjacent to the first area A1.

The first electrode E1 is disposed in a corresponding pixel area PA. In the example of FIG. 3, a lower area of the first electrode E1 does not overlap with the pixel area PA. In some embodiments, the first electrode E1 may overlap with the entire the pixel area PA. In those embodiments, the first electrode E1 is disposed overlapping with the second electrode E2 in the pixel area PA.

The second electrode E2 extends in the first direction X1 to overlap with the pixel area PA. The second electrode E2 receives a common voltage.

The first and second electrodes E1 and E2 include a transparent conductive material (e.g., indium tin oxide (ITO), indium zinc oxide (IZO), indium tin zinc oxide (ITZO), etc.).

The third electrode E3 is disposed in the reflective area RA overlapping with the second electrode E2. In the example of FIG. 3, a width of the third electrode E3 in the first direction X1 is less than a width of the second electrode E2 in the first direction X1. However, the inventive concept is not limited thereto. In some other embodiments, the width of the third electrode E3 in the first direction X1 may be equal to or greater than the width of the second electrode E2 in the first direction X1.

The third electrode E3 may serve as a reflective electrode. The third electrode E3 includes a reflective metal to reflect the light. For instance, the third electrode E3 may include aluminum (Al) or silver (Ag).

The thin film transistor TFT includes a gate electrode GE branching from the gate line GLi, a source electrode SE branching from the data line DLj, and a drain electrode DE connected to the first electrode E1. The drain electrode DE extends (and is electrically connected) to the first electrode E1 through a contact hole CH.

Figure 4:
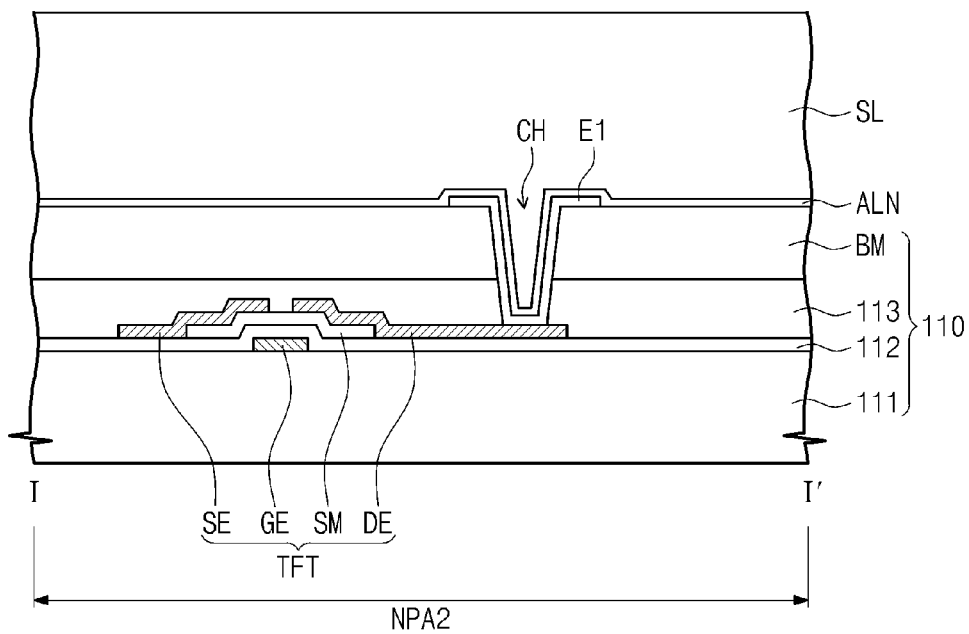
FIG. 4 is a cross-sectional view taken along line I-I' of FIG. 3.
Figure 7:
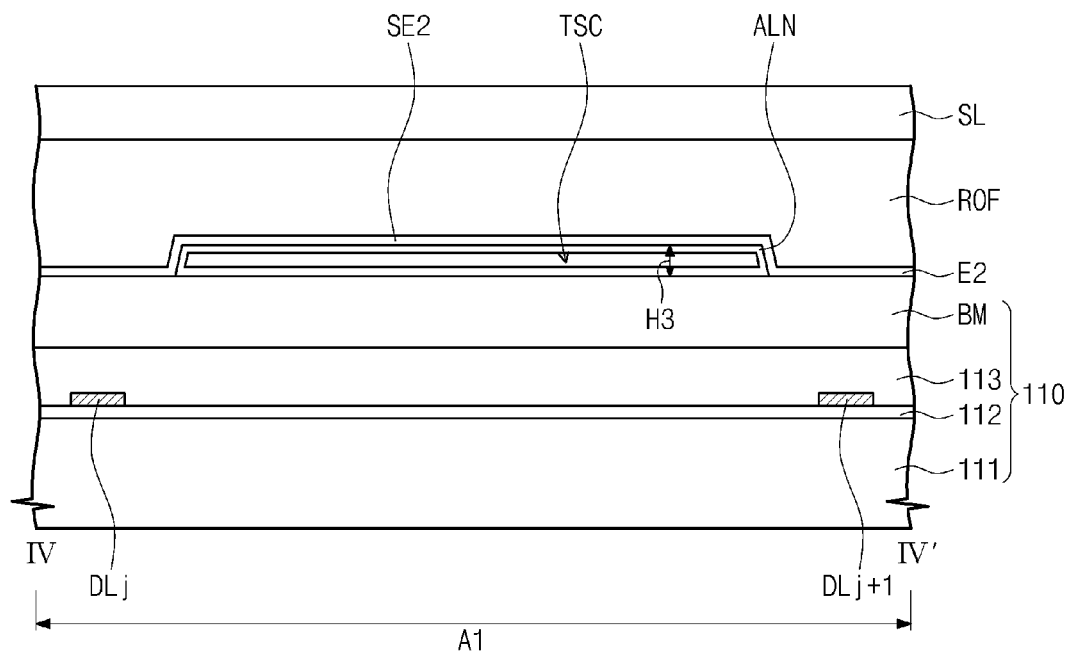
FIG. 7 is a cross-sectional view taken along line IV-IV' of FIG. 3.
Figure 8:
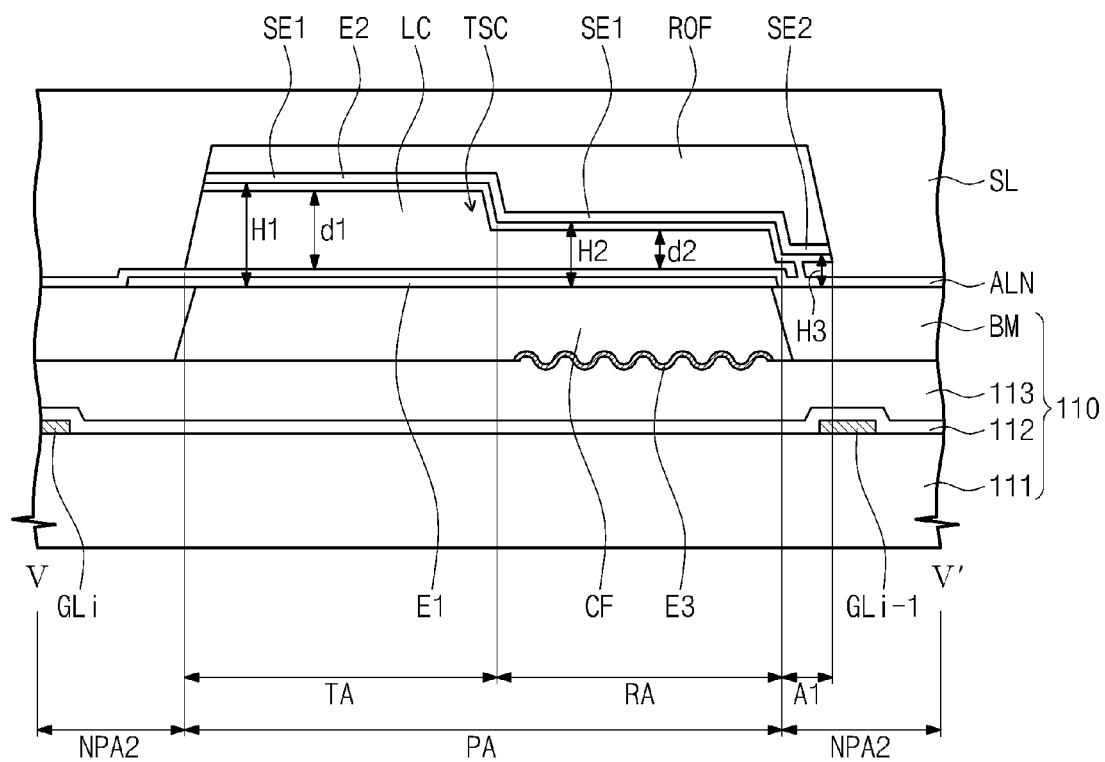
FIG. 8 is a cross-sectional view taken along line V-V' of FIG. 3.

FIG. 4 is a cross-sectional view taken along line I-I' of FIG. 3; FIG. 5 is a cross-sectional view taken along line II-II' of FIG. 3; FIG. 6 is a cross-sectional view taken along line III-III' of FIG. 3; FIG. 7 is a cross-sectional view taken along line IV-IV' of FIG. 3; and FIG. 8 is a cross-sectional view taken along line V-V' of FIG. 3.

Referring to FIGS. 4 to 8, the substrate 110 includes a base substrate 111, the thin film transistor TFT disposed on the base substrate 111, a color filter CF, and a black matrix BM.

In detail, a first insulating layer 112 is disposed on the base substrate 111 covering the gate lines GLi-1 and GLi. The base substrate 111 may be a transparent or non-transparent insulating substrate (e.g., a silicon substrate, a glass substrate, a plastic substrate, etc.).

Although not shown in the figures, the base substrate 111 includes the pixel areas PA and the non-pixel areas NPA1 and NPA2 between the pixel areas PA (similar to the substrate 110).

The first insulating layer 112 may serve as a gate insulating layer. The first insulating layer 112 includes an insulating material (such as silicon nitride, silicon oxide, etc.). The data lines DLj and DLj+1 are disposed on the first insulating layer 112 and extend crossing the gate lines GLi-1 and GLi.

As shown in FIG. 4, the thin film transistor TFT is disposed on the base substrate 111. The thin film transistor TFT includes the gate electrode GE, the semiconductor layer SM, the source electrode SE, and the drain electrode DE.

The gate electrode GE branches from the gate line GLi. Therefore, the first insulating layer 112 is disposed on the base substrate 111 covering the gate electrode GE.

The semiconductor layer SM of the thin film transistor TFT is disposed on the first insulating layer 112 covering the gate electrode GE. Although not shown in the figures, the semiconductor layer SM includes an active layer and an ohmic contact layer.

The source electrode SE and the drain electrode DE of the thin film transistor TFT are disposed on the semiconductor layer SM and the first insulating layer 112, and are spaced apart from each other. The semiconductor layer SM forms a conductive channel between the source electrode SE and the drain electrode DE.

A second insulating layer 113 is disposed on the first insulating layer 112 covering the thin film transistor TFT. The second insulating layer 113 may be, but is not limited to, an organic insulating layer 113 formed of an organic material. As shown in FIGS. 6 and 8, the second insulating layer 113 has a concavo-convex shape in the reflective area RA of the pixel area PA.

The third electrode E3 is disposed on the second insulating layer 113 having the concavo-convex shape in the reflective area RA. Since the third electrode E3 is disposed on the second insulating layer 113 having the concavo-convex shape in the reflective area RA, the third electrode E3 has the same concavo-convex shape as that of the second insulating layer 113. The second insulating layer 113 and the third electrode E3, both having the same concavo-convex shape, can diffuse or scatter the light. Specifically, the third electrode E3 having the concavo-convex shape diffusively reflects an external light incident to the display panel 100.

Although not shown in the figures, a passivation layer may be disposed between the first and second insulating layers 112 and 113 to cover the thin film transistor TFT. The passivation layer covers the exposed semiconductor layer SM.

The color filter CF and the black matrix BM are disposed on the second insulating layer 113. In addition, the color filter CF is disposed on the second insulating layer 113 covering the third electrode E3. As shown in FIGS. 5, 6, and 8, the color filter CF is disposed in the pixel area PA.

The black matrix BM is disposed in the first and second non-pixel areas NPA1 and NPA2. The color filter CF and the black matrix BM overlap with each other in the pixel area PA and the first and second non-pixel areas NPA1 and NPA2.

The color filter CF assigns a color to the light passing through the pixel PXij. The color filter CF may include one of red, green, and blue color filters, and is disposed corresponding to the pixel area PA.

The color filter CF may further include a white color filter. The color filters CF are arranged such that pixels adjacent to each other (among the pixels PX11 to PXnm shown in FIG. 1) display different colors.

The black matrix BM blocks light that is unnecessary to display the image. The black matrix BM may prevent light leakage caused by misalignment of liquid crystal molecules at the edges of the pixel area PA or improper color mixing at the edges of the color filter CF.

The first electrode E1 is disposed on the color filter CF and a portion of the black matrix BM in the second non-pixel area NPA2. The drain electrode DE of the thin film transistor TFT extends (and is electrically connected) to the first electrode E1 through the contact hole CH formed through the black matrix BM and the second insulating layer 113.

An alignment layer ALN is disposed on the black matrix BM in the second non-pixel area NPA2, covering the first electrode E1. Specifically, the alignment layer ALN is disposed on the color filter CF covering the first electrode E1, and is disposed on an inner surface of the second electrode E2 inside the tunnel-shaped cavity TSC. The alignment layer ALN may include polyimide (PI).

The second electrode E2 is disposed on the black matrix BM and the color filter CF and extends in the first direction X1. The first sub-electrode SE1 of the second electrode E2 overlaps with the pixel areas PA arranged in the first direction X1 and the first non-pixel area NPA1 between the pixel areas PA. The first sub-electrode SE1 is disposed adjacent to the black matrix BM in the first non-pixel area NPA1, and spaced apart upward from the color filter CF in the pixel area PA.

As shown in FIG. 8, the second electrode E2 is spaced apart from the color filter CF by a first height H1 in the transmissive area TA. The second electrode E2 is spaced apart from the color filter CF by a second height H2 in the reflective area RA. The second electrode E2 is spaced apart from the black matrix BM by a third height H3 in a portion of the first area A1 that does not overlap with the first non-pixel area NPA1.

Figure 5:
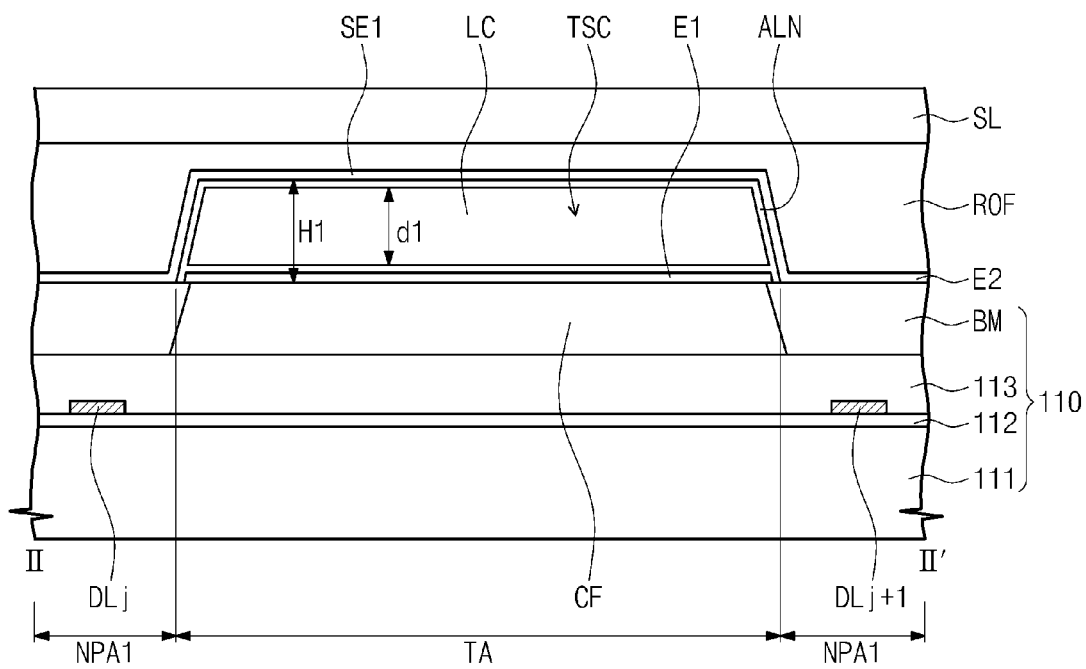
FIG. 5 is a cross-sectional view taken along line II-II' of FIG. 3.

Accordingly, referring to FIGS. 5 and 8, the first sub-electrode SE1 of the second electrode E2 is spaced apart from the color filter CF by the first height H1 in the transmissive area TA. Referring to FIGS. 6 and 8, the first sub-electrode SE1 is spaced apart from the color filter CF by the second height H2 in the reflective area RA. The second height H2 is less than the first height H1.

The second sub-electrode SE2 is connected to the first sub-electrode SE1 and disposed in the first area A1. The second sub-electrode SE2 is disposed adjacent to the black matrix BM in the portion of the first area A1 (that overlaps with the first non-pixel area NPA1), and is spaced apart upward from the black matrix BM in another portion of the first area A1 (that does not overlap with the first non-pixel area NPA1).

Referring to FIGS. 7 and 8, the second sub-electrode SE2 is spaced apart from the black matrix BM by the third height H3 in the portion of the first area A1 that does not overlap with the first non-pixel area NPA1. The third height H3 is less than the second height H2. Preferably, the third height H3 is equal to or less than about 1.1. micrometers.

As previously described, the tunnel-shaped cavity TSC is defined by the space formed between the first sub-electrode SE1 and the color filter CF in the pixel area PA, and also the space formed between the second sub-electrode SE2 and the black matrix BM in the first area A1.

Thus, the tunnel-shaped cavity TSC is disposed having the first height H1 from the substrate 110 in the transmissive area TA and the second height H2 from the substrate 110 in the reflective area RA. In addition, the tunnel-shaped cavity TSC is disposed having the third height H3 from the substrate 110 in the portion of the first area A1 that does not overlap with the first non-pixel area NPA1.

The alignment layer ALN is disposed on the inner surface of the first and second sub-electrodes SE1 and SE2 in the tunnel-shaped cavity TSC. In addition, the alignment layer ALN encloses the tunnel-shaped cavity TSC in the first area A1 as shown in FIG. 8. That is, the alignment layer ALN encloses the tunnel-shaped cavity TSC in the first area A1 adjacent to the reflective area RA. The liquid crystal layer LC is disposed in the tunnel-shaped cavity TSC.

Figure 6:
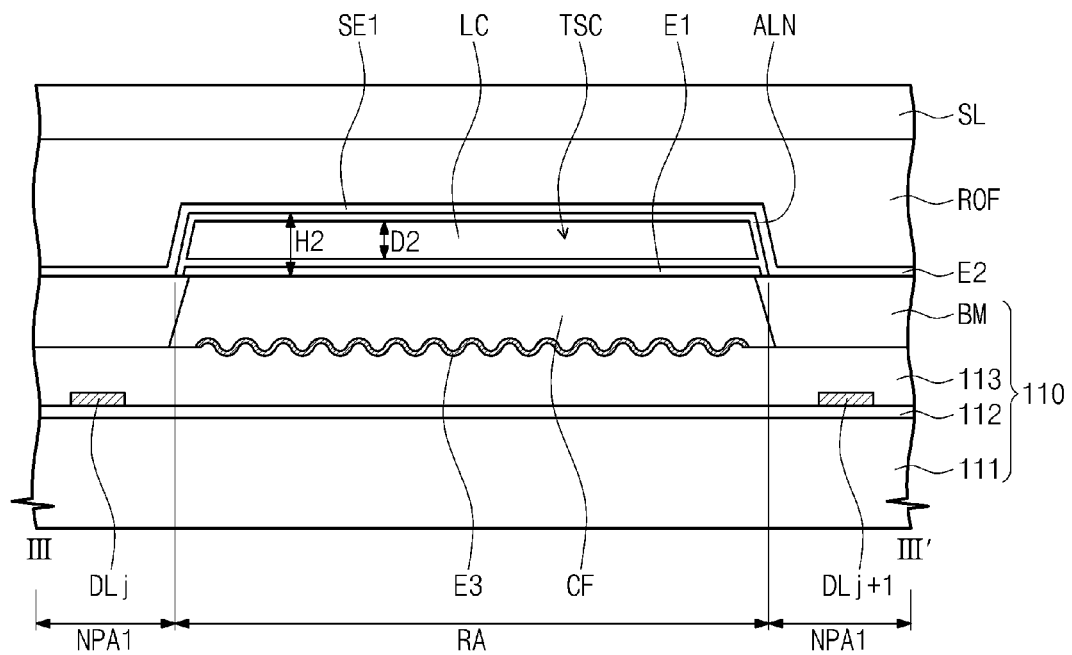
FIG. 6 is a cross-sectional view taken along line III-III' of FIG. 3.

As shown in FIGS. 5, 6, and 8, the liquid crystal layer LC has a first distance d1 in the transmissive area TA and a second distance d2 in the reflective area RA.

In detail, the first distance d1 corresponds to a difference in height between the alignment layer ALN disposed on the first electrode E1 in the transmissive area TA and the alignment layer ALN disposed on the inner surface of the second electrode E2 in the transmissive area TA. The second distance d2 corresponds to a difference in height between the alignment layer ALN disposed on the first electrode E1 in the reflective area RA and the alignment layer ALN disposed on the inner surface of the second electrode E2 in the reflective area RA. The second distance d2 is less than the first distance d1. In some preferred embodiments, the second distance d2 may be half of the first distance d1.

Hereinafter, the first distance d1 is referred to as a first cell gap d1 and the second distance d2 is referred to as a second cell gap d2. The first cell gap d1 corresponds to a thickness of the liquid crystal layer LC in the transmissive area TA and the second cell gap d2 corresponds to a thickness of the liquid crystal layer LC in the reflective area RA.

An anisotropic refractive index of the liquid crystal molecules of the liquid crystal layer LC is represented by "$\Delta n$". In this case, the liquid crystal layer LC has an optical property of "$\Delta n d1$" in the transmissive area TA and has an optical property of "$\Delta n d2$" in the reflective area RA.

The roof layer ROF is disposed on the upper surface of the first and second sub-electrodes SE1 and SE2. The roof layer ROF extends in the first direction X1 in which the first and second sub-electrodes SE1 and SE2 extend, so as to cover the upper surface of the first and second sub-electrodes SE1 and SE2. The roof layer ROF planarizes an upper surface of the second electrode E2. That is, an upper surface of the roof layer ROF is planarized.

The tunnel-shaped cavity TSC extends in the second direction X1 and both end portions of the tunnel-shaped cavity TSC are opened. That is, the end portion in an upper direction of the tunnel-shaped cavity TSC in the plan view and the end portion in a lower direction of the tunnel-shaped cavity TSC in the plan view are opened since the roof layer ROF is not formed on both the end portions of the tunnel-shaped cavity TSC. As described above, the alignment layer ALN encloses the tunnel-shaped cavity TSC in the first area A1 adjacent to the reflective area RA.

Although not shown in the figures, the inorganic insulating layer may be further disposed between the second electrode EL2 and the roof layer ROF. The inorganic insulating layer may include an insulating material (e.g., silicon nitride, silicon oxide, etc.). The inorganic insulating layer supports the roof layer ROF such that the tunnel-shaped cavity TSC is supported in a stable manner by the roof layer ROF.

The sealing layer SL is disposed on the roof layer ROF. The sealing layer SL covers the base substrate 111 to block both the end portions of the tunnel-shaped cavity TSC, thereby sealing the tunnel-shaped cavity TSC. The sealing layer SL is disposed covering the alignment layer ALN (as previously mentioned, the alignment layer ALN encloses the tunnel-shaped cavity TSC in the first area A1).

The roof layer ROF may include an organic layer formed of an organic material and the sealing layer SL may include an organic layer formed of an organic material. However, the roof layer ROF and the sealing layer SL are not limited to the above materials. In some other embodiments, the sealing layer SL may include an organic layer formed of an organic material and/or an inorganic layer formed of an inorganic material.

The thin film transistor TFT is turned on in response to a gate signal provided through the gate line GLi. The data voltage provided through the data line DLj is applied to the first electrode E1 through the turned-on thin film transistor TFT. The common voltage is applied to the second electrode E2.

An electric field is formed between the first electrode E1 and the second electrode E2 due to the voltage difference between the data voltage and the common voltage. The liquid crystal molecules of the liquid crystal layer LC are driven by the electric field formed between the first electrode E1 and the second electrode E2. Accordingly, the amount of light passing through the liquid crystal layer LC is changed, and thus a desired image is displayed.

In the above-described embodiments, the display device 500 can be manufactured using a single substrate 110. Accordingly, the manufacturing costs of the display device 500 may be reduced.

The third electrode E3 has a concavo-convex shape and is disposed on the first electrode E1 in the reflective area RA. The alignment layer ALN is disposed on the third electrode E3, but may be disposed non-uniformly in the reflective area RA due to the concavo-convex shape of the third electrode E3. As a result, the alignment layer ALN may be non-uniformly formed in the pixel area PA.

However, according to the present exemplary embodiment, the third electrode E3 is disposed under the first electrode E1 and on the second insulating layer 113, and the first electrode E1 is disposed on the color filter CF (which is in turn disposed on the second insulating layer 113). The first electrode E1 disposed on the planarized color filter CF has a planarized shape without having the concavo-convex shape, and thus the alignment layer ALN is uniformly formed in the pixel area PA.

The display device 500 may be operated in a reflective mode and/or a transmissive mode. Hereinafter, the reflective mode and the transmissive mode of the display device 500 will be described in detail with reference to FIGS. 9A, 9B, 10A, and 10B.

Figure 9A:
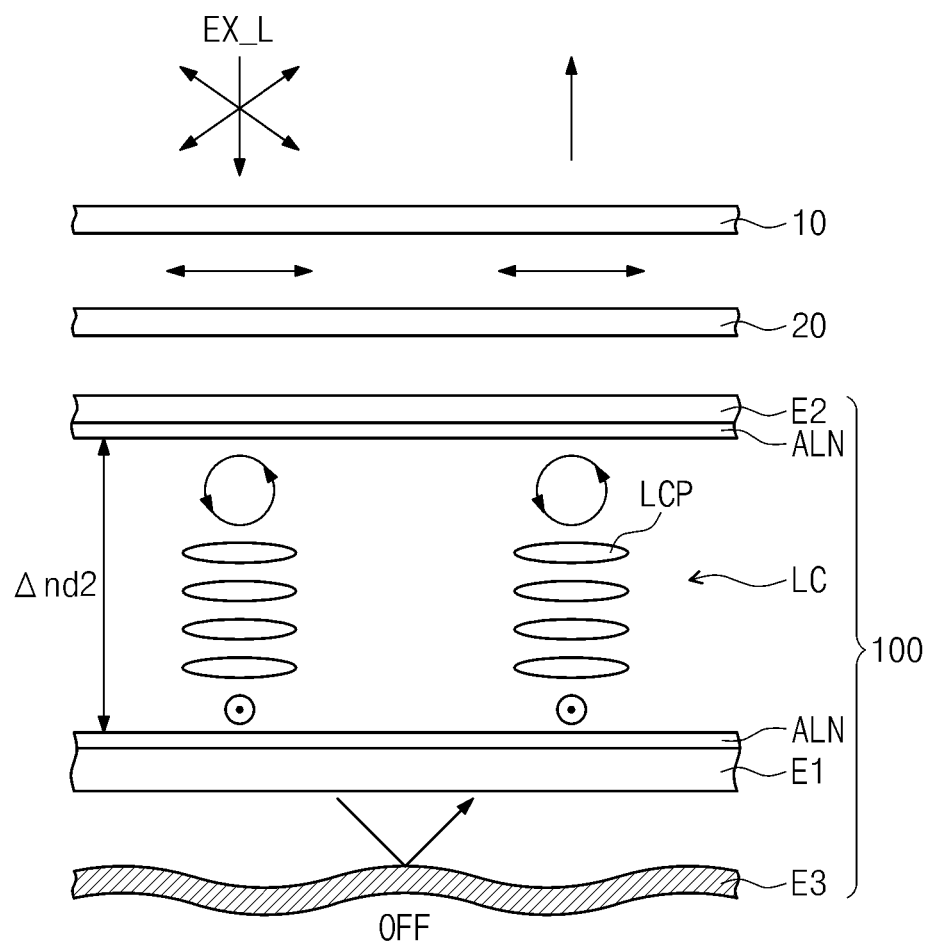
FIGS. 9A and 9B are views of a display device when operated in a reflective mode according to an exemplary embodiment of the present disclosure.
Figure 9B:
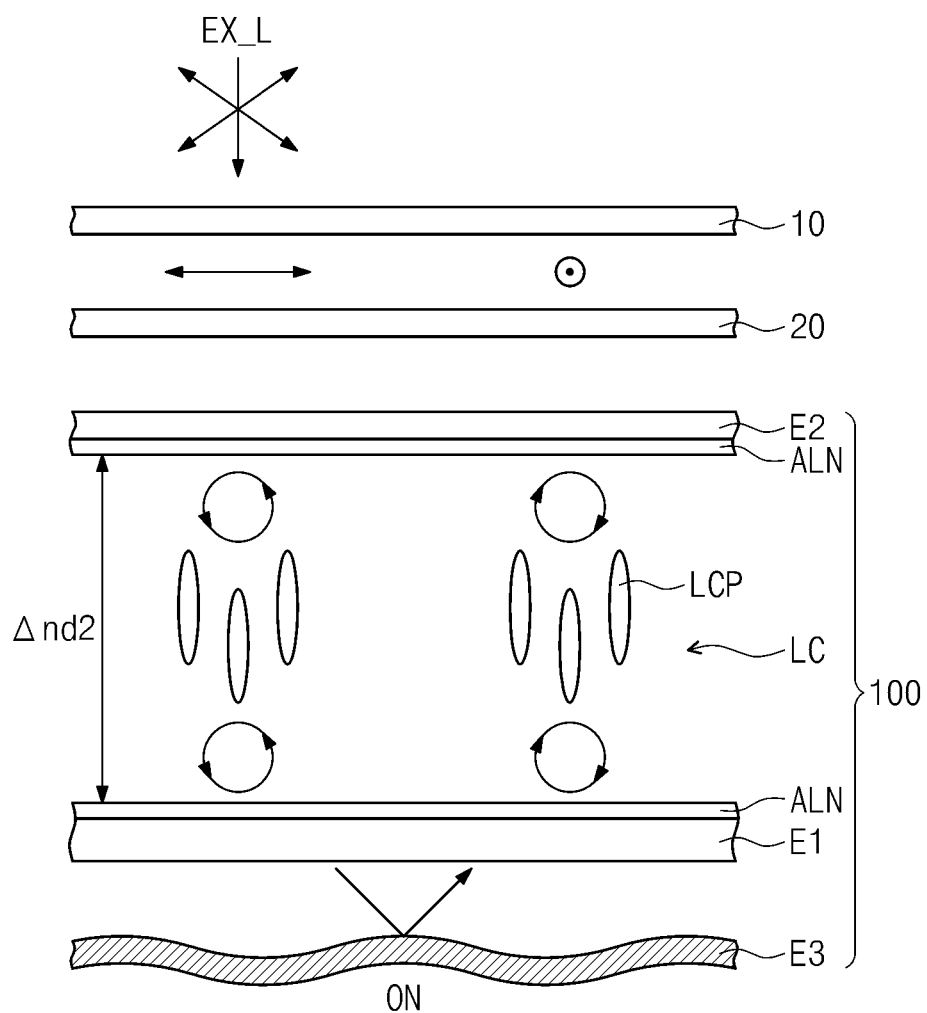
Figure 10A:
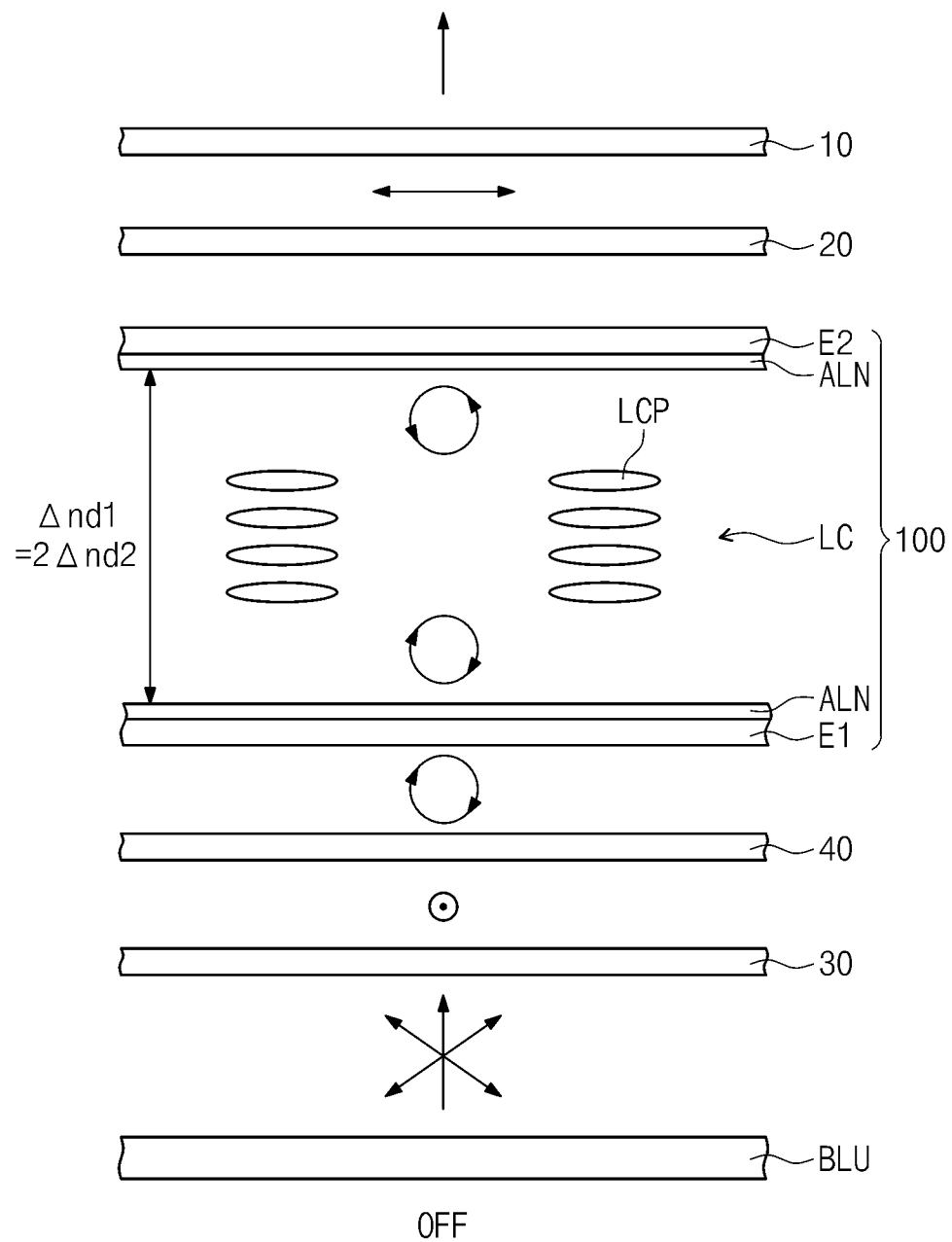
FIGS. 10A and 10B are views of a display device when operated in a transmissive mode according to an exemplary embodiment of the present disclosure.
Figure 10B:
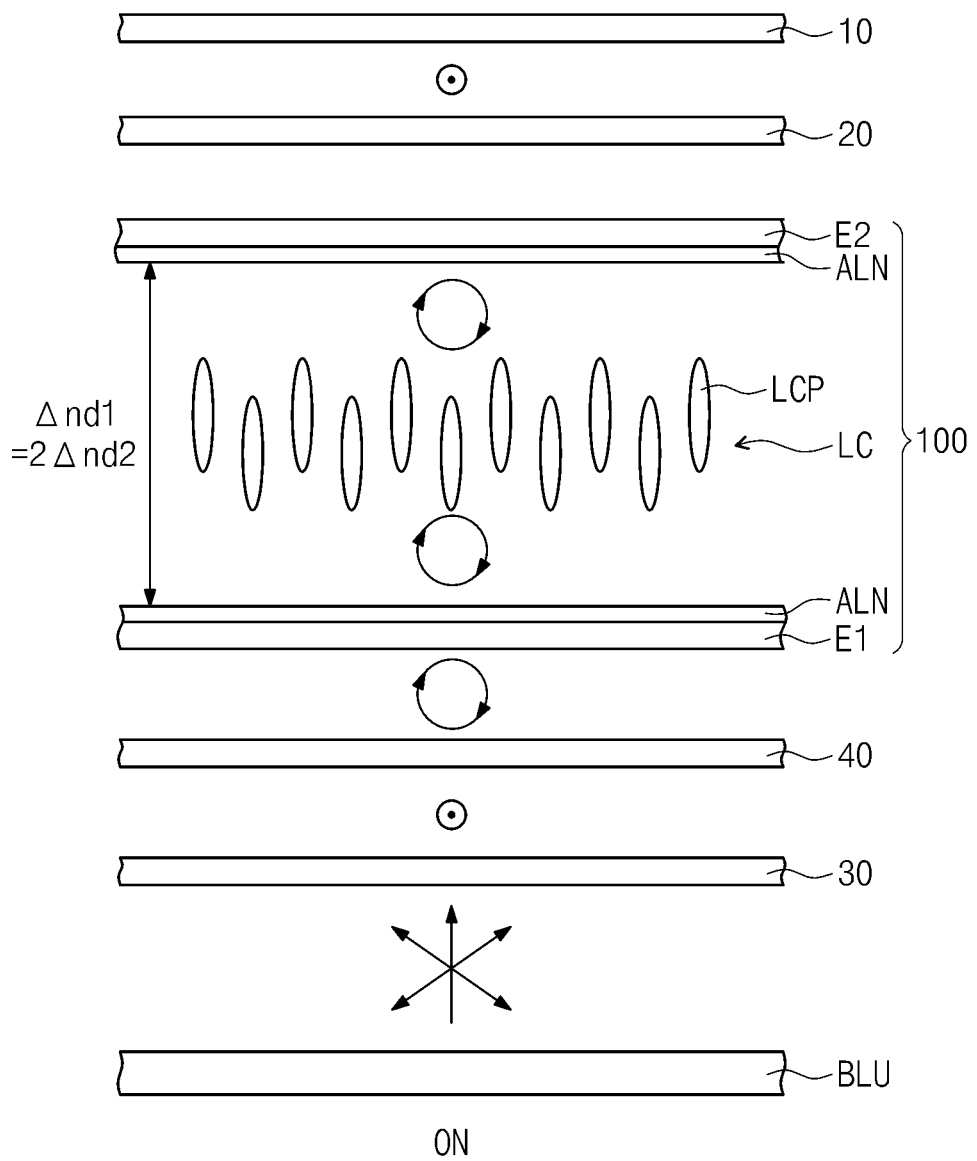

FIGS. 9A and 9B are views of a display device when operated in a reflective mode according to an exemplary embodiment of the present disclosure. FIGS. 10A and 10B are views of a display device when operated in a transmissive mode according to an exemplary embodiment of the present disclosure.

As an example, the liquid crystal layer LC shown in FIGS. 9A, 9B, 10A, and 10B may include, but is not limited to, a normally white mode liquid crystal layer LC that displays a white color when no voltage is applied to the liquid crystal layer LC.

Referring to FIGS. 9A and 9B, the display device 500 includes a first polarizing film 10 and a first retardation film 20 which are disposed on the display panel 100. The retardation film 20 has a retardation value of $\lambda/4$.

The liquid crystal layer LC is not driven when the reflective mode is in an off state (in which no voltage is applied to the first and second electrodes E1 and E2). The second cell gap d2 of the reflective area RA corresponds to half of the first cell gap d1 of the transmissive area TA, and the retardation value of the liquid crystal layer LC is $\lambda/4$ when the reflective mode is in the off state. That is, when linearly polarized light passes through the liquid crystal layer LC in the reflective area RA, the linearly polarized light is changed to circularly polarized light. On the contrary, when circularly polarized light passes through the liquid crystal layer LC in the reflective area RA, the circularly polarized light is changed to linearly polarized light.

The external light EX_L incident to the display panel 100 from the upper portion of the display panel 100 changes into linearly polarized light after passing through the first polarizing plate 10, and the linearly polarized light changes into left circularly polarized light after passing through the first retardation film 20. However, in some other embodiments, the linearly polarized light may change into right circularly polarized light after passing through the first retardation film 20. Hereinafter, the light exiting from the first retardation film 20 will be referred to as left circularly polarized light.

The liquid crystal molecules LCP are in a horizontal alignment state since no voltage is applied to the liquid crystal molecules LCP when the left circularly polarized light passes through the liquid crystal layer LC. Due to the horizontal alignment state of the liquid crystal molecules LCP, a phase of the left circularly polarized light is changed by $\lambda/4$, and thus the left circularly polarized light changes into the linearly polarized light.

The linearly polarized light is reflected by the third electrode E3 after passing through the first electrode E1, and the linearly polarized light reflected by the third electrode E3 passes through the liquid crystal layer LC again. The phase of the linearly polarized light reflected by the third electrode E3 is changed by $\lambda/4$ while passing through the liquid crystal layer LC, and the linearly polarized light becomes the left circularly polarized light.

The left circularly polarized light is changed to the same linearly polarized light as the external light EX_L while passing through the first retardation film 20, and the linearly polarized light then exits from the first polarizing plate 10. Accordingly, the display device 500 displays the white color.

During the reflective mode, the external light EX_L incident to the display panel 100 is diffused by the third electrode E3 having the concavo-convex shape, so that a viewing angle of the display device 500 may be increased.

The liquid crystal layer LC is operated when the reflective mode is in an on state (in which the data voltage is applied to the first electrode E1 and the common voltage is applied to the second electrode E2). The external light EX_L changes into linearly polarized light after passing through the first polarizing plate 10, and the linearly polarized light changes into left circularly polarized light after passing through the first retardation film 20.

The liquid crystal molecules LCP of the liquid crystal layer LC are in a vertical alignment state as a result of the voltage applied thereto. Therefore, the left circularly polarized light passes through the liquid crystal layer LC unchanged. The left circularly polarized light passing through the liquid crystal layer LC passes through the first electrode E1 and is reflected by the third electrode E3. The left circularly polarized light changes into right circularly polarized light after being reflected by the third electrode E3, and the right circularly polarized light passes through the liquid crystal layer LC unchanged.

The phase of the right circularly polarized light passing through the liquid crystal layer LC is changed by $\lambda/4$ by the first retardation film 20, and thus the right circularly polarized light changes into the linearly polarized light that is retarded by $\lambda/2$. The $\lambda/4$-retarded linearly polarized light does not pass through the first polarizing plate 10. Thus, the display device 500 displays the black color.

Referring to FIGS. 10A and 10B, the display device 500 includes the first polarizing plate 10 and the first retardation film 20 which are disposed on the display panel 100, a second polarizing plate 30 and a second retardation film 40 which are disposed under the display panel 100, and a backlight unit BLU disposed under the display panel 100 to provide light to the display panel 100. Each of the first and second retardation films 20 and 40 has the retardation value of $\lambda/4$.

The liquid crystal layer LC is not operated when the transmissive mode is in the off state (in which no voltage is applied to the first and second electrodes E1 and E2). The first cell gap d1 of the transmissive area TA is two times greater than the second cell gap d2 of the reflective area RA, and the retardation value of the liquid crystal layer LC of the transmissive area TA in the off state is $\lambda/2$. That is, when the light passing through the liquid crystal layer LC of the transmissive area TA comprises linearly polarized light, the linearly polarized light passing through the liquid crystal layer LC is changed to a linearly polarized light that is polarized in a symmetrical direction.

The light traveling to the display panel 100 from the backlight unit BLU is changed to the linearly polarized light while passing through the second polarizing plate 30, and the linearly polarized light is changed to a right circularly polarized light by the second retardation film 40. The right circularly polarized light is provided to the liquid crystal layer LC through the first electrode E1. When the right circularly polarized light passes through the liquid crystal layer LC, the liquid crystal molecules LCP are maintained in the horizontal alignment state since no voltage is applied to the liquid crystal molecules LCP.

The right circularly polarized light is changed to the left circularly polarized light by the horizontally aligned liquid crystal layer 300 and the phase of the right circularly polarized light is changed by $\lambda/4$ by the first retardation film 20, and thus the right circularly polarized light changes into the linearly polarized light. The linearly polarized light exits from the first polarizing plate 10. Accordingly, the display device 500 displays the white color.

The liquid crystal layer LC is operated when the transmissive mode is in the on state (in which the data voltage is applied to the first electrode E1 and the common voltage is applied to the second electrode E2). The light provided to the display panel 100 from the backlight unit BLU is changed to the linearly polarized light while passing through the second polarizing plate 30, and the linearly polarized light is changed to the right circularly polarized light by the second retardation film 40.

The right circularly polarized light is provided to the liquid crystal layer LC via the first electrode E1. The liquid crystal molecules LCP of the liquid crystal layer LC are vertically aligned in response to the voltage applied thereto. Therefore, the right circularly polarized light passes through the liquid crystal layer LC unchanged.

The phase of the right circularly polarized light passing through the liquid crystal layer LC is changed by $\lambda/4$ by the first retardation film 20, and thus the right circularly polarized light changes into the linearly polarized light that is retarded by λ/2. The λ/4-retarded linearly polarized light does not pass through the first polarizing plate 10. Accordingly, the display device 500 displays the black color.

As described above, the display device 500 is operated in both the reflective mode and the transmissive mode (i.e., a transflective mode).

As a result, the viewing angle of the display device 500 may be increased, the alignment layer may be uniformly formed, and the display device 500 may be operated in the transflective mode.

FIGS. 11 to 20 depict different views of the display device 500 according to an exemplary method of manufacturing the display device 500. In the interest of clarity, the first electrodes E1 have been omitted in the pixel area PA in FIGS. 11 to 20, and the method of manufacturing the display device 500 will be described with reference to the substrate 110.

Figure 11:
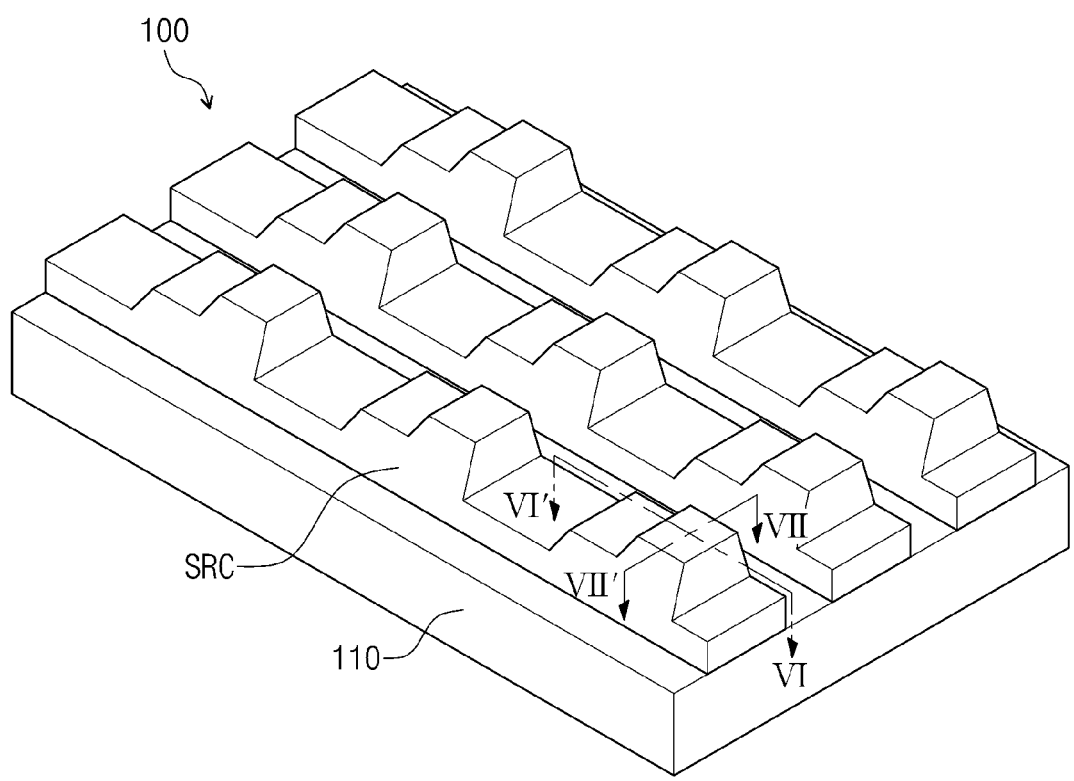
FIG. 11 is a perspective view of a sacrificial layer formed on a substrate.
Figure 11:
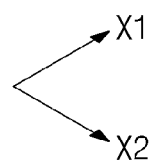
Figure 12A:
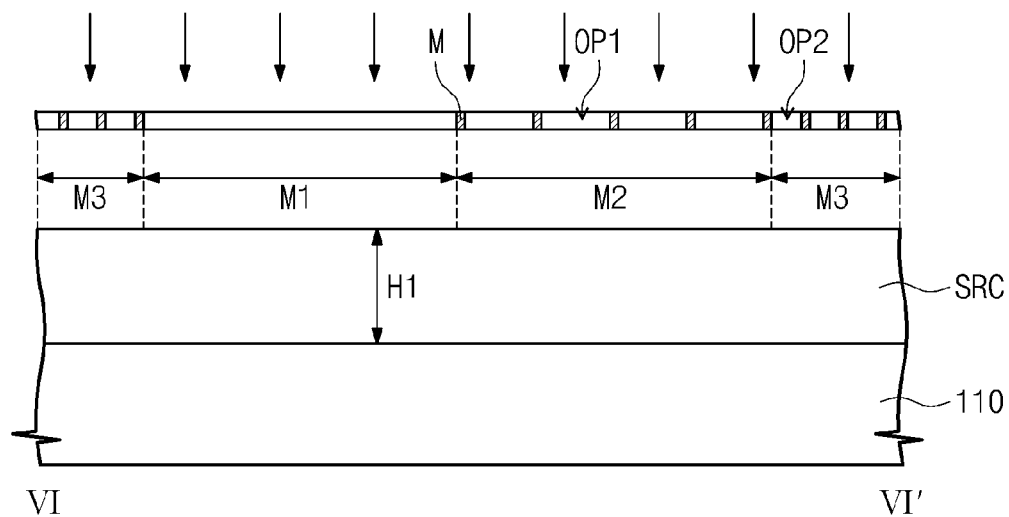
FIGS. 12A and 12B are cross-sectional views of the sacrificial layer taken along line VI-VI' of FIG. 11 according to an exemplary method of manufacturing the display device.
Figure 12B:
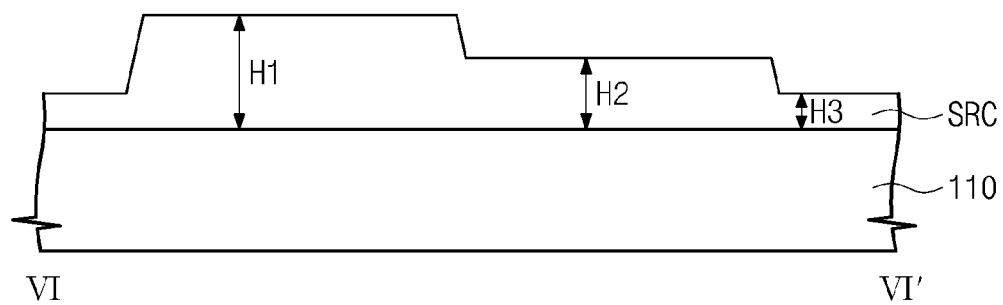
Figure 13A:
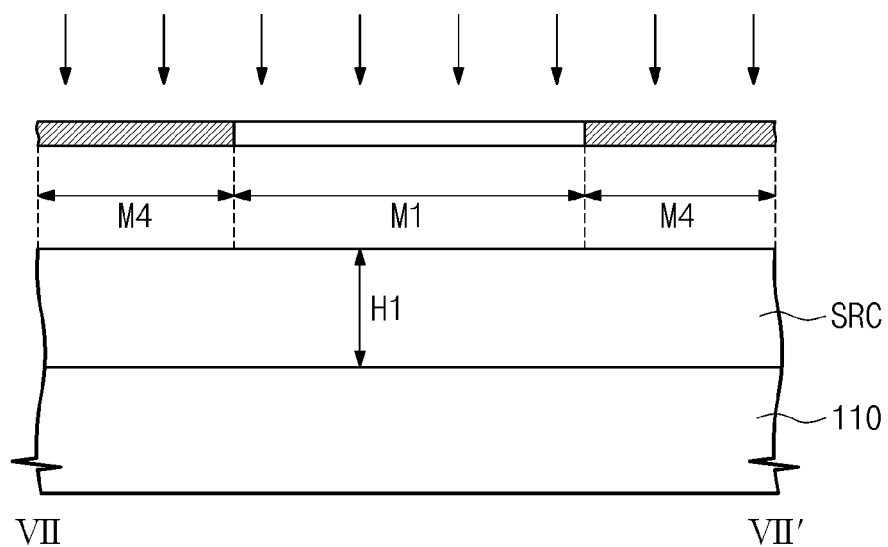
FIGS. 13A and 13B are cross-sectional views of the sacrificial layer taken along line VII-VII' of FIG. 11 according to an exemplary method of manufacturing the display device.
Figure 13B:
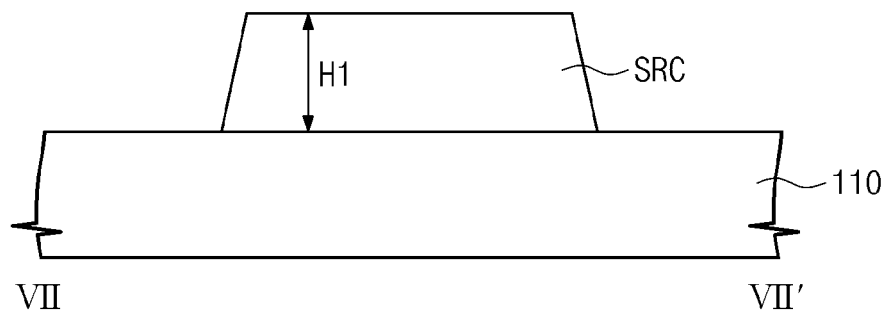

FIG. 11 is a perspective view of a sacrificial layer formed on the substrate 110. FIGS. 12A and 12B are cross-sectional views of the sacrificial layer taken along line VI-VI' of FIG. 11. FIGS. 13A and 13B are cross-sectional views of the sacrificial layer taken along line VII-VII' of FIG. 11.

Referring to FIG. 11, the substrate 110 is provided and a plurality of sacrificial layers SRC are formed on the substrate 110 extending in the second direction X2. The configuration of the substrate 110 is the same as in the previously-described FIGS. 4 to 8.

Referring to FIGS. 12A and 12B, the sacrificial layer SRC is formed having the first height H1 on the substrate 110. The sacrificial layer SRC is formed of a negative type photoresist.

A mask M is disposed above the sacrificial layer SRC. The mask M includes a transmissive portion M1, a first semi-transmissive portion M2, and a second semi-transmissive portion M3. The first semi-transmissive portion M2 includes a first opening OP1 and the second semi-transmissive portion M3 includes a second opening OP2. The first opening OP1 is greater than the second opening OP2.

An exposure process is performed using the mask M. A portion of the sacrificial layer SRC corresponding to the transmissive portion M1 is exposed. Portions of the sacrificial layer SRC corresponding respectively to the first and second semi-transmissive portions M2 and M3 are partially exposed. In addition, since the first opening OP1 is greater than the second opening OP2, the portion of the sacrificial layer SRC corresponding to the first semi-transmissive portion M2 is exposed to a greater degree than the portion of the sacrificial layer SRC corresponding to the second semi-transmissive portion M3.

Since the sacrificial layer SRC is formed of a negative type photoresist, the exposed portions remain after a developing process is performed thereon. Accordingly, the portion of the sacrificial layer SRC exposed through the first transmissive portion M1 has the first height H1 after the developing process. The portion of the sacrificial layer SRC exposed through the second semi-transmissive portion M2 has the second height H2 after the developing process, and the portion of the sacrificial layer SRC exposed through the third semi-transmissive portion M3 has the third height H3 after the developing process.

As described above, the first height H1 is greater than the second height H2. The third height H3 is less than the second height H2. In some preferred embodiments, the third height H3 may be equal to or less than about 1.1 micrometers.

Referring to FIGS. 13A and 13B, the sacrificial layer SRC is formed having the first height H1 on the substrate 110. A mask M is disposed on the sacrificial layer SRC and includes a transmissive portion M1 and a blocking portion M4.

The exposure process is performed using the mask M. The portion of the sacrificial layer SRC corresponding to the transmissive portion M1 is exposed, whereas the portion of the sacrificial layer SRC corresponding to the blocking portion M4 is not exposed. The portion of the sacrificial layer SRC, which is exposed through the transmissive portion M1, remains having the first height H1 after the developing process. The portion of the sacrificial layer SRC, which is not exposed by the blocking portion M4, is removed after the developing process.

Figure 14A:
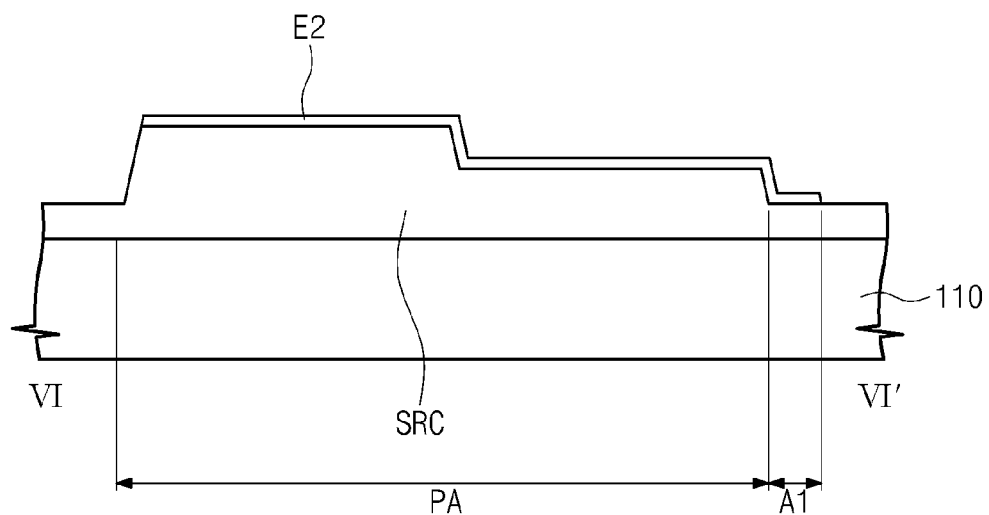
FIGS. 14A and 14B are cross-sectional views of a second electrode taken along lines VI-VI' and VII-VII' of FIG. 11.
Figure 14B:
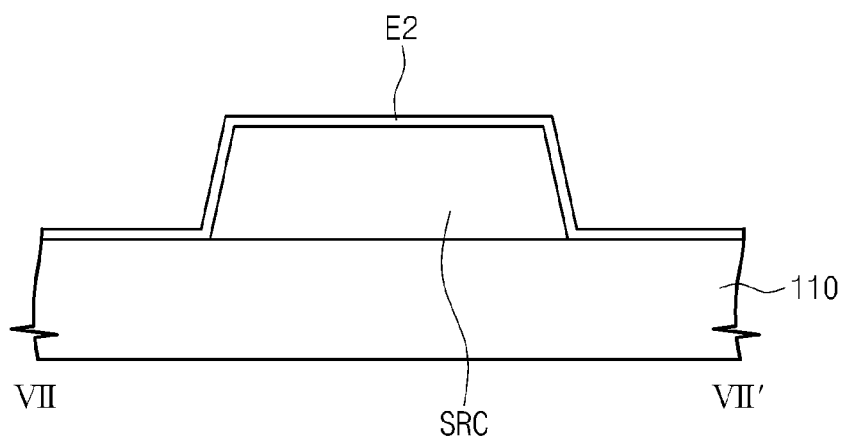

FIGS. 14A and 14B are cross-sectional views of the second electrode taken along lines VI-VI' and VII-VII' of FIG. 11.

Referring to FIGS. 14A and 14B, the second electrodes E2 are formed on the sacrificial layer SRC. The second electrodes E2 extend in the first direction X1 and are spaced apart from each other. Each of the second electrodes E2 is formed overlapping with the pixel areas PA and the first area A1 in the first direction X1.

Although not shown in the figures, the second electrodes E2 are formed by: forming a conductive layer on the sacrificial layer SRC, forming a photoresist pattern (having the same pattern as the desired second electrodes) on the conductive layer, and etching the conductive layer using the photoresist pattern as a mask. The conductive layer may include a transparent conductive material (e.g., indium tin oxide, indium zinc oxide, indium tin zinc oxide, etc.). The photoresist pattern is removed after the second electrodes E2 are formed.

Figure 15A:
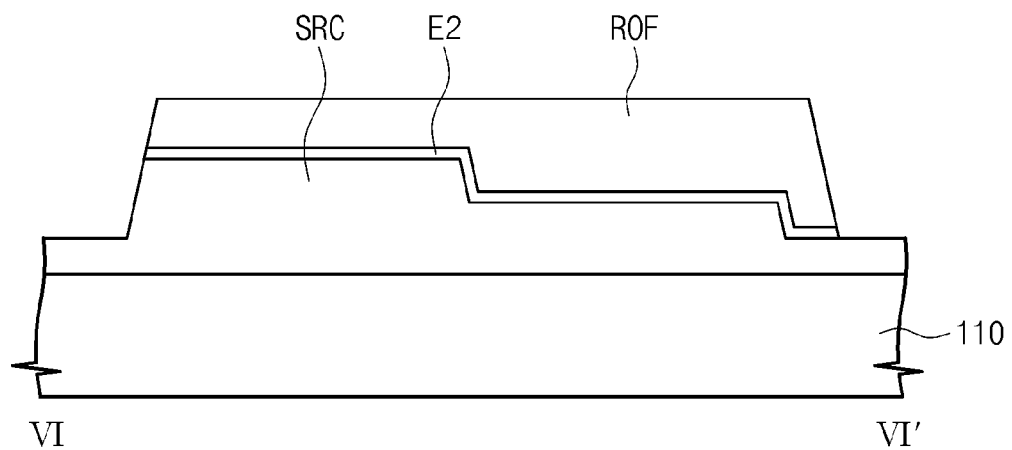
FIGS. 15A and 15B are cross-sectional views of a roof layer taken along lines VI-VI' and VII-VII' of FIG. 11.
Figure 15B:
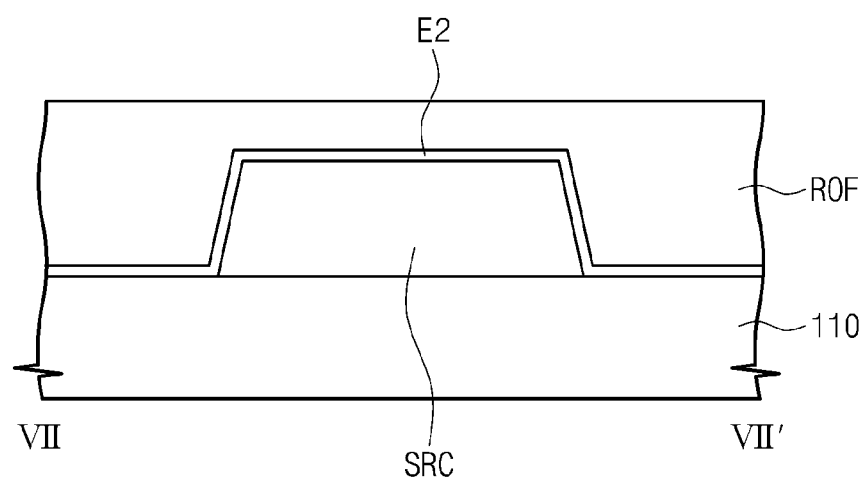

FIGS. 15A and 15B are cross-sectional views of the roof layer taken along lines VI-VI' and VII-VII' of FIG. 11.

Referring to FIGS. 15A and 15B, the roof layer ROF is formed on the substrate 110 covering the upper surface of the second electrode E2. The roof layer ROF extends in the first direction X1. Therefore, the second electrode E2 and the roof layer ROF overlap with each other when viewed in a plan view, and thus the second electrode E2 and the roof layer ROF have the same shape. The upper surface of the sacrificial layer SRC is exposed in an area in which the second electrode E2 and the roof layer ROF are not formed. The upper surface of the roof layer ROF is planarized.

Figure 16A:
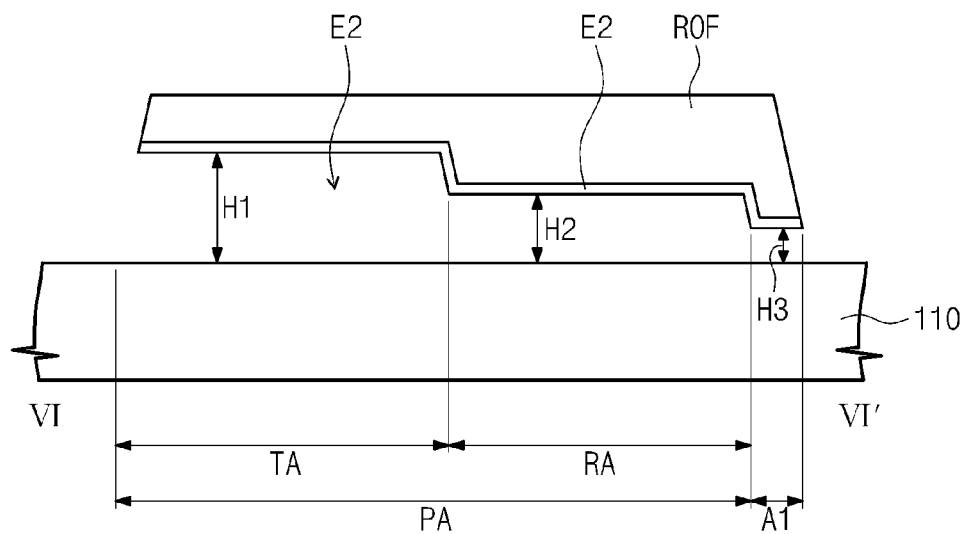
FIGS. 16A and 16B are cross-sectional views of a tunnel-shaped cavity taken along lines VI-VI' and VII-VII' of FIG. 11.
Figure 16B:
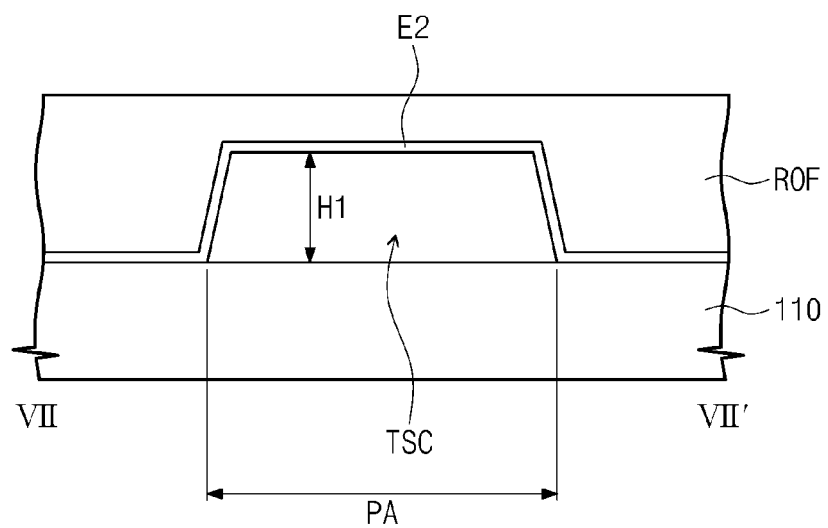

FIGS. 16A and 16B are cross-sectional views of the tunnel-shaped cavity taken along lines VI-VI' and VII-VII' of FIG. 11.

Referring to FIGS. 16A and 16B, the sacrificial layer SRC is removed by a wet etching process to form the tunnel-shaped cavity TSC. The sacrificial layer SRC is etched starting from the exposed portion to the inner portion thereof. Accordingly, the tunnel-shaped cavity TSC extends in the second direction X2, and the sacrificial layer SRC at both the end portions of the tunnel-shaped cavity TSC in the second direction X2 is etched.

Since the tunnel-shaped cavity TSC is formed by removing the sacrificial layer SRC, the tunnel-shaped cavity TSC has the first height H1 in the transmissive area TA. In addition, the tunnel-shaped cavity TSC has the second height H2 in the reflective area RA and has the third height H3 in the first area A1.

FIGS. 17A to 17D are cross-sectional views of an alignment layer taken along lines VI-VI' and VII-VII' of FIG. 11.

Figure 17A:
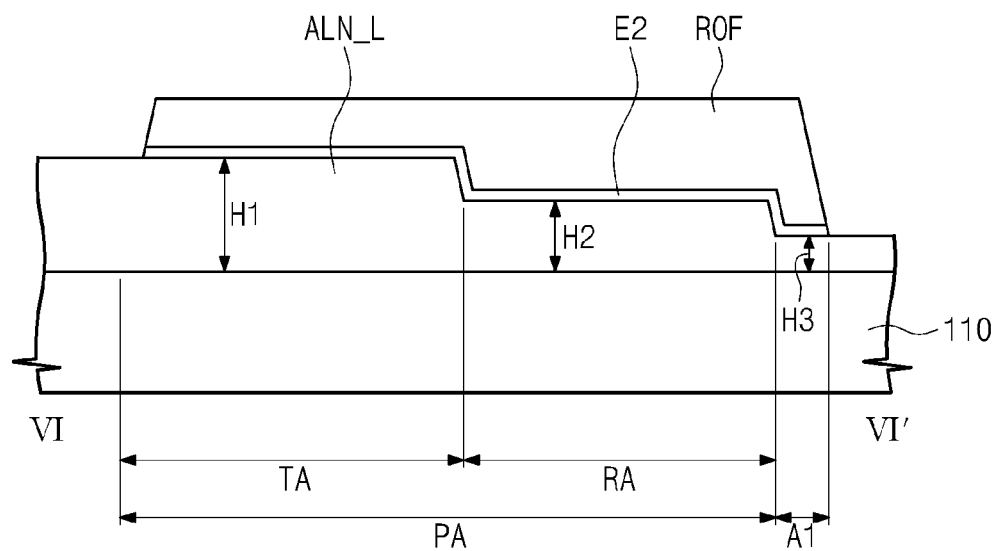
FIGS. 17A to 17D are cross-sectional views of an alignment layer taken along lines VI-VI' and VII-VII' of FIG. 11.

Referring to FIG. 17A, an alignment solution ALN_L is provided on the substrate 110. The tunnel-shaped cavity TSC is filled with the alignment solution ALN_L. The alignment solution ALN_L may include polyimide (PI).

Figure 17B:
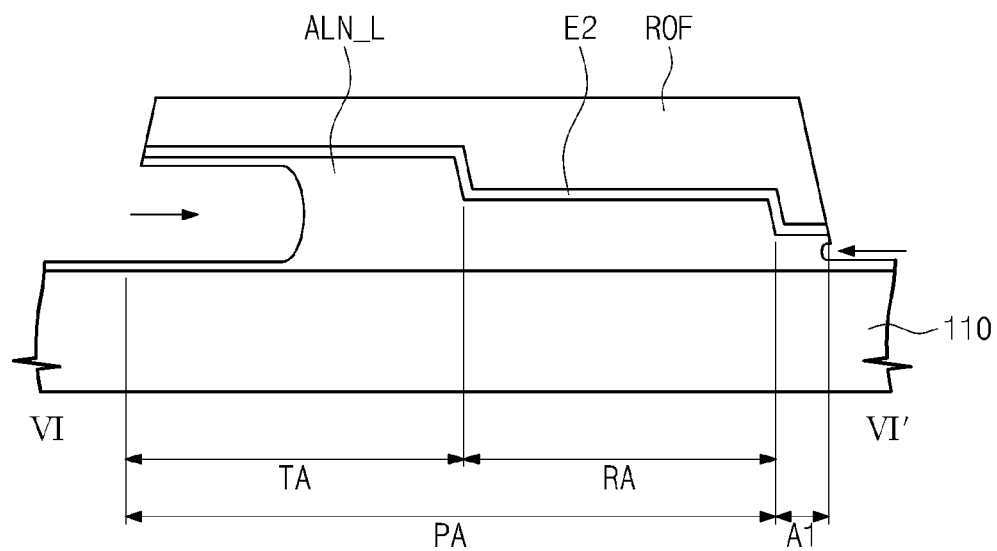
Figure 17C:
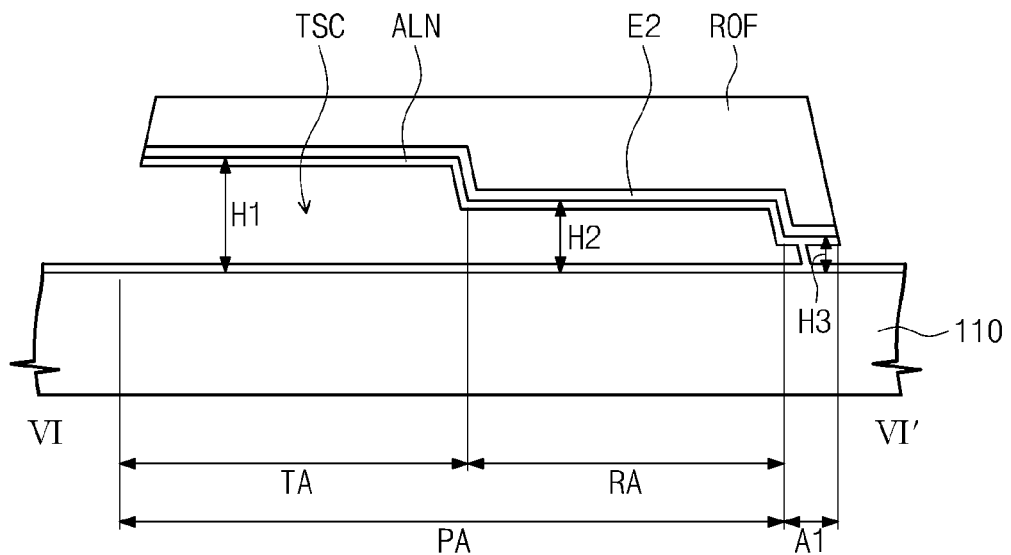
Figure 17D:
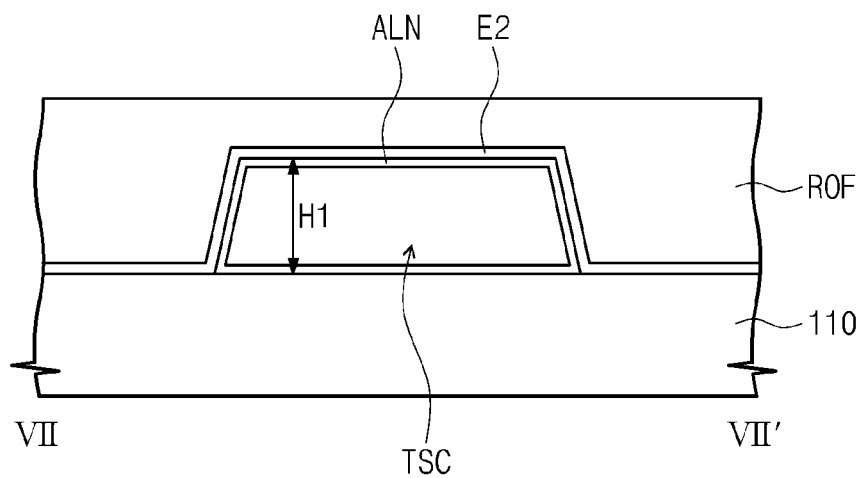

Referring to FIGS. 17B, 17C, and 17D, the alignment solution ALN_L is dried to form the alignment layer ALN.

The alignment layer ALN is formed on the substrate 110 and on the inner surface of the second electrode E2 in the tunnel-shaped cavity TSC.

A drying rate of the alignment solution ALN_L in the tunnel-shaped cavity TSC is proportional to a size of the tunnel-shaped cavity TSC. As described above, the tunnel-shaped cavity TSC has the first height H1 in the transmissive area TA, the second height H2 in the reflective area RA, and the third height H3 in the first area A1. Therefore, the drying rate of the alignment solution ALN_L is fastest in the transmissive area TA and slowest in the first area A1.

The alignment solution ALN_L dries rapidly in the transmissive area TA and slowly in the first area A1. The drying rate of the alignment solution ALN_L in the reflective area RA is slower than in the transmissive area TA, but faster than in the first area A1. In this case, the alignment solution ALN_L (that starts drying from both the end portions) is bound together in a predetermined area according to the drying rate. That is, the alignment solution ALN_L (that starts drying from both the end portions) is bound together in the first area A1 adjacent to the reflective area RA due to the difference in drying rate of the alignment solution ALN_L.

As an example, when the third height H3 is less than about 1.1 micrometers, the alignment layer is bound together in the first area A1 adjacent to the reflective area RA. That is, the alignment solution ALN_L drying in the transmissive area TA and the alignment solution ALN_L drying in the reflective area RA may be bound to each other in the first area A1 adjacent to the reflective area RA. Accordingly, as shown in FIG. 17C, the alignment layer ALN is formed enclosing the tunnel-shaped cavity TSC in the first area A1.

Figure 18A:
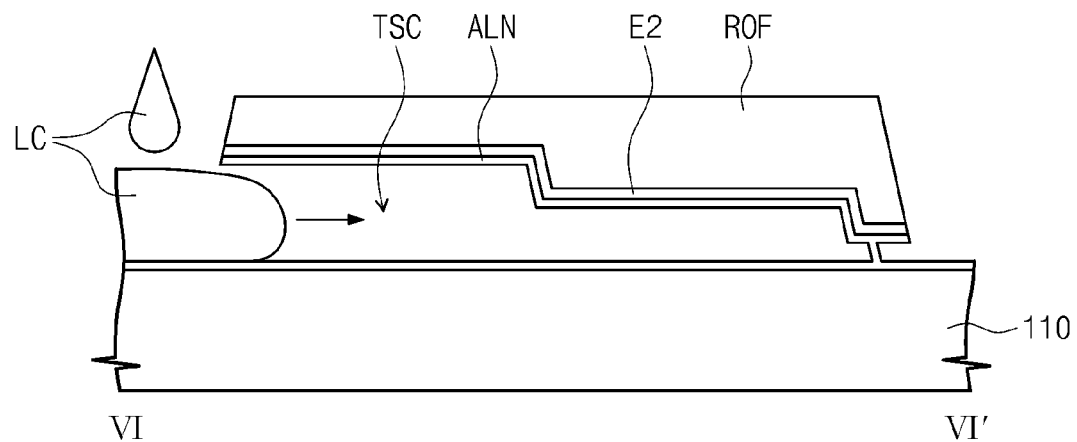
FIGS. 18A and 18B are cross-sectional views of a liquid crystal layer in the tunnel-shaped cavity taken along lines VI-VI' and VII-VII' of FIG. 11.
Figure 18B:
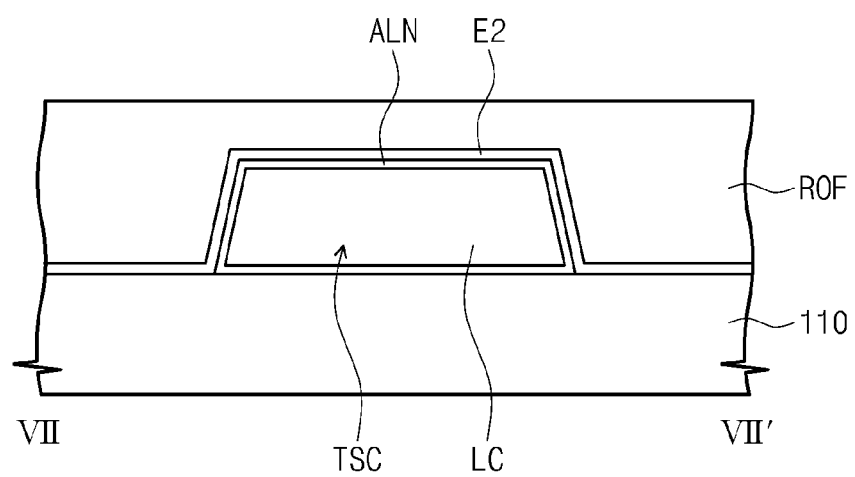

FIGS. 18A and 18B are cross-sectional views of the liquid crystal layer in the tunnel-shaped cavity taken along lines VI-VI' and VII-VII' of FIG. 11.

Referring to FIGS. 18A and 18B, the liquid crystal layer LC is formed in the tunnel-shaped cavity TSC. A liquid crystal material in liquid state is provided at a position adjacent to the tunnel-shaped cavity TSC and flows into the tunnel-shape cavity TSC by capillary action. The liquid crystal material may be provided, at the position adjacent to the one end portion of the tunnel-shaped cavity TSC formed in the transmissive area TA, by an inkjet method using a micropipette.

The liquid crystal layer LC is contained in the tunnel-shape cavity TSC, and does not leak from the tunnel-shaped cavity TSC because the alignment layer ALN encloses the tunnel-shaped cavity TSC in the first area A1.

Figure 19A:
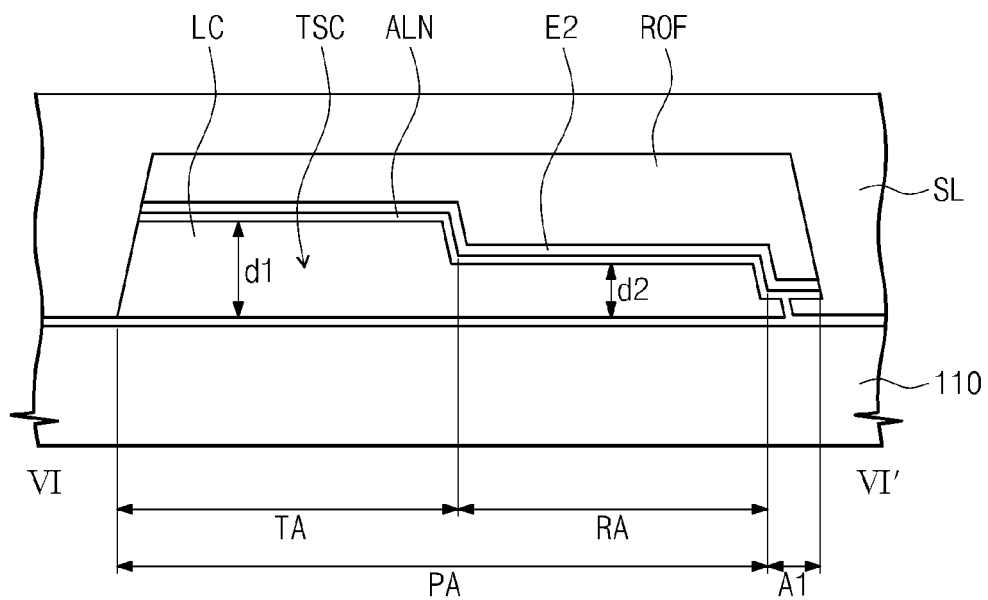
FIGS. 19A and 19B are cross-sectional views of a sealing layer taken along lines VI-VI' and VII-VII' of FIG. 11.
Figure 19B:
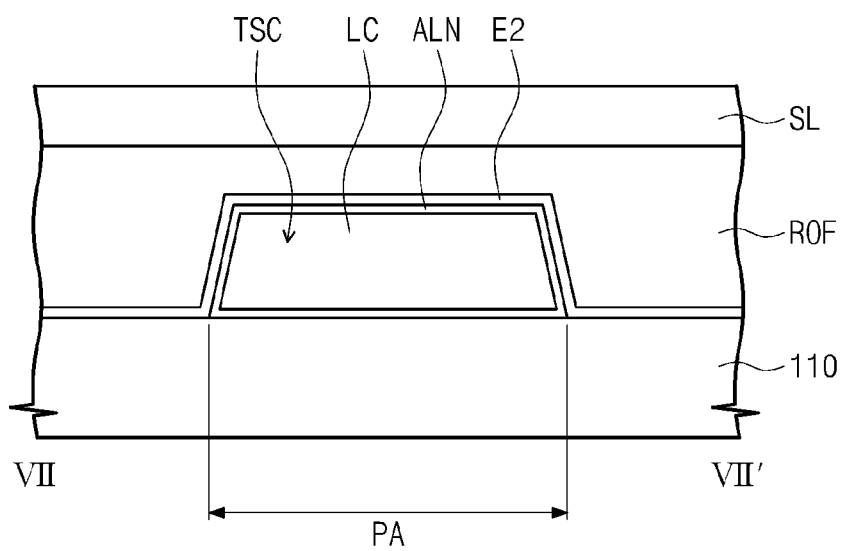

FIGS. 19A and 19B are cross-sectional views of the sealing layer taken along lines VI-VI' and VII-VII' of FIG. 11.

Referring to FIGS. 19A and 19B, the liquid crystal material is removed except in the area where the tunnel-shaped cavity TSC is formed. The sealing layer SL is formed on the roof layer ROF. Specifically, the sealing layer SL covers the substrate 110 and blocks both the end portions of the tunnel-shaped cavity TSC, thereby sealing the tunnel-shaped cavity TSC. The sealing layer SL is formed in contact with the alignment layer ALN (that encloses the tunnel-shaped cavity TSC in the first area A1).

The liquid crystal layer LC has a thickness corresponding to the first distance d1 in the transmissive area TA of the pixel area PA. In addition, the liquid crystal layer LC has a thickness corresponding to the second distance d2 in the reflective area RA of the pixel area PA.

Thus, the liquid crystal layer LC has the optical property of "$\Delta nd1$" in the transmissive area TA and the optical property of "$\Delta nd2$" in the reflective area RA. Accordingly, the display device 500 may be operated in both the reflective mode and the transmissive mode.

Consequently, the viewing angle of the display device 500 (manufactured using the above-mentioned method) may be increased, the alignment layer may be uniformly formed, and the display device 500 may be operated in the transflective mode.

Although exemplary embodiments of the inventive concept have been described, it is understood that the inventive concept should not be limited to these exemplary embodiments but various changes and modifications can be made by one of ordinary skill in the art within the spirit and scope of the present disclosure.

What is claimed is:

1. A display device comprising:
a substrate including a plurality of pixel areas and a non-pixel area disposed between the pixel areas, wherein each of the pixel areas comprises a transmissive area and a reflective area;
a tunnel-shaped cavity disposed on the substrate in each of the pixel areas;
an image display layer disposed in the tunnel-shaped cavity;
a roof layer disposed on the tunnel-shaped cavity and having an upper planarized surface;
a black matrix disposed on the substrate in the non-pixel area; and
a reflective electrode disposed under the tunnel-shaped cavity in the reflective area of each of the pixel areas to reflect an external light,
wherein the tunnel-shaped cavity has a closed end and an open end facing each other, and the closed end is formed in the reflective area and the open end is formed in the transmissive area.

2. The display device of claim 1, further comprising a color filter disposed on the substrate in each of the pixel areas.

3. The display device of claim 2, wherein the color filter comprises a red color filter, a green color filter, or a blue color filter.

4. The display device of claim 2, further comprising:
a first electrode disposed on the color filter; and
a second electrode extending in a first direction and spaced apart upward from the substrate in the pixel area and a predetermined area of the non-pixel area to define the tunnel-shaped cavity, wherein the roof layer is disposed on the second electrode.

5. The display device of claim 4,
wherein the non-pixel area comprises:
a first non-pixel area disposed between the pixel areas in the first direction and extending in a second direction crossing the first direction; and
a second non-pixel area disposed between the pixel areas in the second direction and extending in the first direction, the reflective area is disposed adjacent to the first non-pixel area, and the second electrode extends in a first area defined by a predetermined area of the second non-pixel area in the second direction.

6. The display device of claim 5, wherein the tunnel-shaped cavity has a first height in the transmissive area, a second height in the reflective area, and a third height in the first area that does not overlap with the first non-pixel area, wherein the second height is less than the first height and greater than the third height.

7. The display device of claim 6, wherein the second electrode is spaced apart from the color filter by the first height in the transmissive area, spaced apart from the color filter by the second height in the reflective area, and spaced apart from the black matrix by the third height in the first area that does not overlap with the first non-pixel area.

8. The display device of claim 6, wherein the third height is equal to or less than about 1.1 micrometers.

9. The display device of claim 4, further comprising:
- a thin film transistor disposed on the substrate in the non-pixel area and connected to the first electrode; and
- an insulating layer disposed on the substrate covering the thin film transistor and having a concavo-convex shape in the reflective area, wherein the reflective electrode is disposed on the insulating layer in the reflective area and having the concavo-convex shape, and the color filter and the black matrix are disposed on the insulating layer.

10. The display device of claim 9, further comprising an alignment layer disposed on an inner surface of the second electrode in the tunnel-shaped cavity and on the substrate covering the first electrode, wherein the alignment layer encloses the tunnel-shaped cavity in the first area adjacent to the reflective area.

11. The display device of claim 10, wherein the image display layer has a first distance corresponding to a difference in height between the alignment layer disposed on the first electrode in the transmissive area and the alignment layer disposed on the inner surface of the second electrode in the transmissive area, and a second distance corresponding to a difference in height between the alignment layer disposed on the first electrode in the reflective area and the alignment layer disposed on the inner surface of the second electrode in the reflective area, and wherein the second distance is about half of the first distance.

12. The display device of claim 1, wherein the image display layer is a liquid crystal layer.

13. The display device of claim 1, further comprising a sealing layer disposed on the roof layer and covering the substrate to seal the closed end of the tunnel-shaped cavity.

* * * * *